(12) United States Patent
Takahashi et al.

(10) Patent No.: US 11,595,024 B2
(45) Date of Patent: Feb. 28, 2023

(54) ELASTIC WAVE DEVICE, HIGH-FREQUENCY FRONT END CIRCUIT, AND COMMUNICATION APPARATUS

(71) Applicant: Murata Manufacturing Co., Ltd., Nagaokakyo (JP)

(72) Inventors: Hideaki Takahashi, Nagaokakyo (JP); Hirokazu Sakaguchi, Nagaokakyo (JP); Yasuharu Nakai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 912 days.

(21) Appl. No.: 16/429,098

(22) Filed: Jun. 3, 2019

(65) Prior Publication Data
US 2019/0288668 A1 Sep. 19, 2019

Related U.S. Application Data

(63) Continuation of application No. PCT/JP2017/037941, filed on Oct. 20, 2017.

(30) Foreign Application Priority Data

Dec. 5, 2016 (JP) .............................. JP2016-235936

(51) Int. Cl.
*H03H 9/145* (2006.01)
*H03H 9/02* (2006.01)
(Continued)

(52) U.S. Cl.
CPC .... *H03H 9/14541* (2013.01); *H03H 9/02559* (2013.01); *H03H 9/02818* (2013.01);
(Continued)

(58) Field of Classification Search
CPC .. H03H 9/02559; H03H 9/14541; H03H 9/25; H03H 9/6483; H03H 9/725
See application file for complete search history.

(56) References Cited

U.S. PATENT DOCUMENTS 7,411,473 B2 * 8/2008 Kando ............... H03H 9/14532
333/195
7,554,428 B2 * 6/2009 Yamamoto ......... H03H 9/14541
29/25.35
(Continued)

FOREIGN PATENT DOCUMENTS

CN 101421921 A 4/2009
JP 2010-283807 A 12/2010
(Continued)

OTHER PUBLICATIONS

Official Communication issued in International Patent Application No. PCT/JP2017/037941, dated Jan. 9, 2018.
(Continued)

*Primary Examiner* — Hafizur Rahman
*Assistant Examiner* — Alan Wong
(74) *Attorney, Agent, or Firm* — Keating & Bennett, LLP

(57) ABSTRACT

An elastic wave device includes a piezoelectric substrate, an IDT electrode on the piezoelectric substrate, and a silicon oxide film arranged on the piezoelectric substrate to cover the IDT electrode. The IDT electrode includes first and second electrode layers laminated on each other, the first electrode layer is made of metal or an alloy with a density higher than a density of metal of the second electrode layer and a density of silicon oxide of the silicon oxide film, the piezoelectric substrate is made of $LiNbO_3$ and $\theta$ is in a range of equal to or greater than about 8° and equal to or less than about 32° with Euler Angles (0°±5°, $\theta$, 0°±10°) of the
(Continued)

piezoelectric substrate, and the silicon oxide film contains hydrogen atoms, hydroxyl groups, or silanol groups.

18 Claims, 26 Drawing Sheets

(51) Int. Cl.
 *H03H 9/25* (2006.01)
 *H03H 9/64* (2006.01)
 *H03H 9/72* (2006.01)
(52) U.S. Cl.
 CPC ............ *H03H 9/145* (2013.01); *H03H 9/25* (2013.01); *H03H 9/6483* (2013.01); *H03H 9/72* (2013.01); *H03H 9/725* (2013.01); *H03H 9/6489* (2013.01)

(56) References Cited

U.S. PATENT DOCUMENTS

| | | | |
|---|---|---|---|
| 7,705,515 B2* | 4/2010 | Nishiyama | H03H 9/02559 310/313 R |
| 7,876,020 B2* | 1/2011 | Mimura | H03H 9/0222 310/313 R |
| 9,035,721 B2* | 5/2015 | Takenoshita | H03H 9/725 333/133 |
| 9,124,243 B2* | 9/2015 | Tamasaki | H03H 9/725 |
| 9,159,900 B2* | 10/2015 | Tamasaki | H01L 41/053 |
| 9,584,088 B2* | 2/2017 | Kikuchi | H03H 9/02582 |
| 10,425,060 B2* | 9/2019 | Nakamura | H03H 9/64 |
| 10,862,451 B2* | 12/2020 | Mimura | H03F 3/21 |
| 11,367,829 B2* | 6/2022 | Saji | C30B 29/30 |
| 2007/0096592 A1 | 5/2007 | Kadota et al. | |
| 2009/0021107 A1* | 1/2009 | Nishiyama | H03H 9/02559 310/313 B |
| 2011/0199168 A1 | 8/2011 | Kadota | |
| 2011/0279177 A1 | 11/2011 | Furutani et al. | |
| 2013/0026881 A1* | 1/2013 | Okamoto | H03H 9/0222 310/313 C |
| 2013/0029033 A1 | 1/2013 | Kikuchi et al. | |
| 2013/0049533 A1 | 2/2013 | Matsuda et al. | |
| 2013/0249647 A1 | 9/2013 | Nakanishi et al. | |
| 2014/0285287 A1 | 9/2014 | Komatsu et al. | |
| 2018/0097500 A1 | 4/2018 | Mimura | |

FOREIGN PATENT DOCUMENTS

| | | | | |
|---|---|---|---|---|
| JP | 2012-175315 A | | 9/2012 | |
| JP | 2012-186808 A | | 9/2012 | |
| JP | 2012175315 A | * | 9/2012 | |
| JP | 5045864 B1 | | 10/2012 | |
| JP | 5136689 B2 | | 2/2013 | |
| JP | 2013-055371 A | | 3/2013 | |
| JP | 2013-066250 A | | 4/2013 | |
| JP | 2013-145930 A | | 7/2013 | |
| JP | 2014-072710 A | | 4/2014 | |
| JP | 2014-187568 A | | 10/2014 | |
| JP | 2015-012324 A | | 1/2015 | |
| JP | 2015-111923 A | | 6/2015 | |
| WO | 2005/034347 A | | 4/2005 | |
| WO | 2007/125733 A1 | | 11/2007 | |
| WO | 2010/087305 A1 | | 8/2010 | |
| WO | 2012/124210 A1 | | 9/2012 | |
| WO | 2017/006742 A1 | | 1/2017 | |

OTHER PUBLICATIONS

Official Communication issued in corresponding Japanese Patent Application No. 2018-554853, dated Aug. 4, 2020.
Official Communication issued in corresponding Korean Patent Application No. 10-2019-7014047, dated Jul. 28, 2020.
First Office Action in CN201780073197.3, dated Nov. 23, 2022, 7 pages.

* cited by examiner

ELASTIC WAVE DEVICE, HIGH-FREQUENCY FRONT END CIRCUIT, AND COMMUNICATION APPARATUS

CROSS REFERENCE TO RELATED APPLICATIONS

This application claims the benefit of priority to Japanese Patent Application No. 2016-235936 filed on Dec. 5, 2016 and is a Continuation Application of PCT Application No. PCT/JP2017/037941 filed on Oct. 20, 2017. The entire contents of each application are hereby incorporated herein by reference.

BACKGROUND OF THE INVENTION

1. Field of the Invention

The present invention relates to an elastic wave device that is used for a resonator, a high-frequency filter, or the like, and to a high-frequency front end circuit and a communication apparatus using the elastic wave device.

2. Description of the Related Art

An existing elastic wave device has been widely used as a resonator or a high-frequency filter.

WO2005/034347 A1 and Japanese Unexamined Patent Application Publication No. 2013-145930 disclose elastic wave devices in which an IDT (interdigital transducer) electrode is provided on a $LiNbO_3$ substrate. In WO2005/034347 A1 and Japanese Unexamined Patent Application Publication No. 2013-145930, a $SiO_2$ film is provided so as to cover the IDT electrode. It is said that the $SiO_2$ film can improve frequency temperature characteristics. In WO2005/034347 A1, the IDT electrode is formed of metal having a density higher than that of Al. On the other hand, Japanese Unexamined Patent Application Publication No. 2013-145930 describes a multilayer metal film in which an Al film is laminated on a Pt film as the IDT electrode.

However, when the IDT electrode having a single layer structure is used as disclosed in WO2005/034347 A1, resistance of electrode fingers is increased and loss is increased in some cases. On the other hand, as disclosed in Japanese Unexamined Patent Application Publication No. 2013-145930, the IDT electrode formed by the multilayer metal film may not provide sufficient frequency temperature characteristics in some cases. When the $SiO_2$ film is provided in order to improve the frequency temperature characteristics, spurious in a higher-order mode may be generated. When all of these characteristics are tried to be improved, IMD (intermodulation distortion) may be deteriorated.

SUMMARY OF THE INVENTION

Preferred embodiments of the present invention provide elastic wave devices each of which is low in loss, is excellent in frequency temperature characteristics, hardly generates spurious in a higher-order mode, and reduces or prevents deterioration in IMD, and also provide high-frequency front end circuits and communication apparatuses including the elastic wave devices.

An elastic wave device according to a preferred embodiment of the present invention includes a piezoelectric substrate, an IDT electrode provided on the piezoelectric substrate, and a silicon oxide film provided on the piezoelectric substrate so as to cover the IDT electrode, wherein the IDT electrode includes a first electrode layer and a second electrode layer laminated on the first electrode layer, the first electrode layer is made of metal or an alloy with a density higher than a density of metal of the second electrode layer and a density of silicon oxide of the silicon oxide film, the piezoelectric substrate is made of $LiNbO_3$ and $\theta$ is in a range of equal to or greater than about 8° and equal to or less than about 32° in Euler Angles (0°±5°, $\theta$, 0°±10°) of the piezoelectric substrate, and the silicon oxide film contains a hydrogen atom, a hydroxyl group, or a silanol group.

In a specific preferred embodiment of the elastic wave device according to the present invention, the elastic wave device utilizes a Rayleigh wave, and a thickness of the first electrode layer is set such that an acoustic velocity of an SH (Shear Horizontal) wave is lower than an acoustic velocity of the Rayleigh wave. In this case, unwanted waves in the vicinity of a pass band are reduced or prevented.

In another specific preferred embodiment of the elastic wave device according to the present invention, the first electrode layer is at least one type selected from a group consisting of Pt, W, Mo, Ta, Au, and Cu and alloys containing Pt, W, Mo, Ta, Au, and Cu as main components.

In still another specific preferred embodiment of the elastic wave device according to the present invention, when a wavelength determined by an electrode finger pitch of the IDT electrode is $\lambda$, a thickness of the first electrode layer is set to a thickness indicated in Table 1 below in accordance with a material of the first electrode layer indicated in Table 1 below. In this case, it is possible to further reduce or prevent unnecessary waves in the vicinity of the pass band.

TABLE 1

| MATERIAL OF FIRST ELECTRODE LAYER | THICKNESS OF FIRST ELECTRODE LAYER |
| --- | --- |
| Pt OR ALLOY CONTAINING Pt AS MAIN COMPONENT | EQUAL TO OR GREATER THAN 0.047 $\lambda$ |
| W OR ALLOY CONTAINING W AS MAIN COMPONENT | EQUAL TO OR GREATER THAN 0.062 $\lambda$ |
| Mo OR ALLOY CONTAINING Mo AS MAIN COMPONENT | EQUAL TO OR GREATER THAN 0.144 $\lambda$ |
| Ta OR ALLOY CONTAINING Ta AS MAIN COMPONENT | EQUAL TO OR GREATER THAN 0.074 $\lambda$ |
| Au OR ALLOY CONTAINING Au AS MAIN COMPONENT | EQUAL TO OR GREATER THAN 0.042 $\lambda$ |
| Cu OR ALLOY CONTAINING Cu AS MAIN COMPONENT | EQUAL TO OR GREATER THAN 0.136 $\lambda$ |

In still another specific preferred embodiment of the elastic wave device according to the present invention, the second electrode layer is made of Al, Cu or an alloy containing Al or Cu as a main component. In this case, resistance of electrode fingers is reduced, and loss is further reduced.

In still another specific preferred embodiment of the elastic wave device according to the present invention, when a wavelength determined by an electrode finger pitch of the IDT electrode is $\lambda$, a thickness of the second electrode layer is equal to or greater than about 0.0175$\lambda$. In this case, the resistance of the electrode fingers is be reduced, and the loss is further reduced.

In still another specific preferred embodiment of the elastic wave device according to the present invention, when a wavelength determined by an electrode finger pitch of the IDT electrode is $\lambda$, a thickness of the silicon oxide film is equal to or greater than about 0.30$\lambda$. In this case, it is possible to further improve frequency temperature characteristics.

In still another specific preferred embodiment of the elastic wave device according to the present invention, a duty ratio of the IDT electrode is equal to or higher than about 0.48. In this case, it is possible to further reduce or prevent spurious in a higher-order mode.

In still another specific aspect of the elastic wave device according to the present invention, a duty ratio of the IDT electrode is equal to or higher than about 0.55. In this case, it is possible to further reduce or prevent the spurious in the higher-order mode.

A high-frequency front end circuit according to a preferred embodiment of the present invention includes an elastic wave device according to one of the preferred embodiments of the present invention and a power amplifier.

A communication apparatus according to a preferred embodiment of the present invention includes a high-frequency front end circuit in accordance with a preferred embodiment of the present invention, and an RF signal processing circuit.

According to preferred embodiments of the present invention, it is possible to provide elastic wave devices each of which is low in loss, excellent in frequency temperature characteristics, hardly generates spurious in a higher-order mode, and reduces or prevents deterioration in IMD.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will now be described with reference to specific preferred embodiments of the present invention and the accompanying drawings.

It should be noted that the preferred embodiments, which are described in the specification, are illustrative and that partial substitution or combination of configurations may be possible between different preferred embodiments.

Figure 1A:
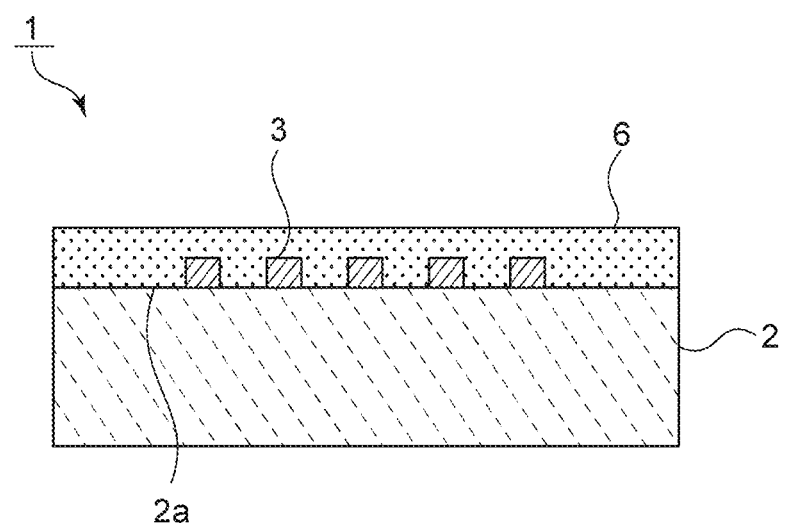
FIG. 1A is a schematic front cross-sectional view of an elastic wave device according to a preferred embodiment of the present invention.
Figure 1B:
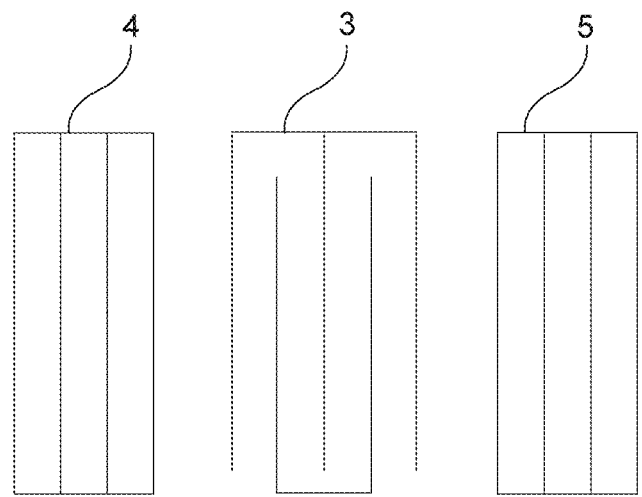
FIG. 1B is a schematic plan view illustrating an electrode structure of the elastic wave device.
Figure 2:
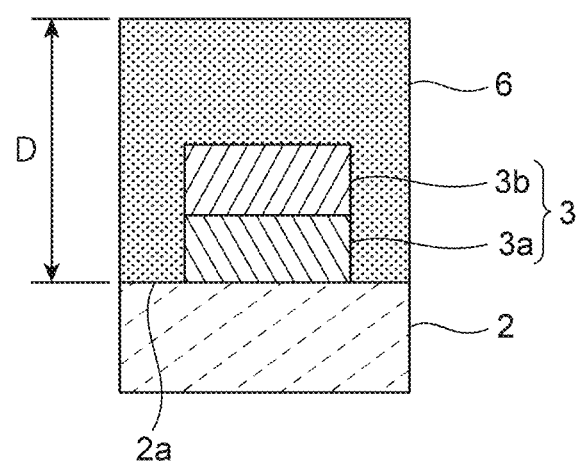
FIG. 2 is an enlarged schematic front cross-sectional view of an electrode portion of the elastic wave device according to a preferred embodiment of the present invention.

FIG. 1A is a schematic front cross-sectional view of an elastic wave device according to a preferred embodiment of the present invention, and FIG. 1B is a schematic plan view illustrating an electrode structure of the elastic wave device. FIG. 2 is an enlarged schematic front cross-sectional view of an electrode portion of the elastic wave device according to the present preferred embodiment of the present invention.

An elastic wave device 1 includes a piezoelectric substrate 2. The piezoelectric substrate 2 includes a main surface 2a. The piezoelectric substrate 2 is made of $LiNbO_3$, for example. In Euler Angles (0°±5°, θ, 0°±10°) of the piezoelectric substrate 2, θ is within a range of equal to or greater than about 8° and equal to or less than about 32°, for example. Therefore, in the elastic wave device 1, it is possible to further reduce or prevent generation of spurious in a higher-order mode as will be described later.

The piezoelectric substrate 2 has piezoelectricity in at least a surface thereof. For example, the piezoelectric substrate 2 may include a piezoelectric thin film on the surface thereof and include a multilayer body of the piezoelectric thin film, a film having a different acoustic velocity from that of the piezoelectric thin film, and a support substrate or the like. The piezoelectric substrate 2 may have piezoelectricity in the overall substrate. In this case, the piezoelectric substrate 2 includes one layer of a piezoelectric layer.

The above θ is preferably equal to or less than about 30°, more preferably equal to or less than about 28°, and still more preferably equal to or greater than about 12° and equal to or less than about 26°, for example. In this case, it is possible to further reduce or prevent the generation of the spurious in the higher-order mode.

An IDT electrode 3 is provided on the main surface 2a of the piezoelectric substrate 2. The elastic wave device 1 utilizes Rayleigh waves as a main mode as elastic waves excited by the IDT electrode 3. In this specification, as illustrated in FIG. 1B, the wavelength of surface acoustic waves as fundamental waves of a longitudinal mode, which is determined by an electrode finger pitch of the IDT electrode 3, is λ.

More specifically, the electrode structure illustrated in FIG. 1B is provided on the piezoelectric substrate 2. That is, the IDT electrode 3 and reflectors 4 and 5 disposed on both sides of the IDT electrode 3 in the propagation direction of the elastic waves are provided. A one port elastic wave resonator is thus configured. However, the electrode structure including the IDT electrode in preferred embodiments of the present invention is not particularly limited. A plurality of resonators may be combined to provide a filter. Examples of such a filter include a ladder filter, a longitudinally-coupled resonator filter, a lattice filter, and the like.

The IDT electrode 3 includes a first busbar and a second busbar, and a plurality of first electrode fingers and a plurality of second electrode fingers. The plurality of first and second electrode fingers extends in a direction perpendicular or substantially perpendicular to the propagation direction of the elastic waves. The plurality of first electrode fingers and the plurality of second electrode fingers are interleaved with each other. The plurality of first electrode fingers is connected to the first bus bar, and the plurality of second electrode fingers is connected to the second bus bar.

As illustrated in FIG. 2, the IDT electrode 3 includes a first electrode layer 3a and a second electrode layer 3b. The second electrode layer 3b is laminated on the first electrode layer 3a. The first electrode layer 3a is made of metal or an alloy having a density higher than that of metal of the second electrode layer 3b and that of silicon oxide of a silicon oxide film 6.

The first electrode layer 3a is made of metal such as Pt, W, Mo, Ta, Au, or Cu or an alloy thereof. It is preferable that the first electrode layer 3a be made of Pt or an alloy containing Pt as a main component.

The thickness of the first electrode layer 3a is preferably set to the thickness indicated in Table 2 below in accordance with a material of the first electrode layer 3a indicated in Table 2 below.

TABLE 2

| MATERIAL OF FIRST ELECTRODE LAYER | THICKNESS OF FIRST ELECTRODE LAYER |
| --- | --- |
| Pt OR ALLOY CONTAINING Pt AS MAIN COMPONENT | EQUAL TO OR GREATER THAN 0.047 λ |
| W OR ALLOY CONTAINING W AS MAIN COMPONENT | EQUAL TO OR GREATER THAN 0.062 λ |
| Mo OR ALLOY CONTAINING Mo AS MAIN COMPONENT | EQUAL TO OR GREATER THAN 0.144 λ |
| Ta OR ALLOY CONTAINING Ta AS MAIN COMPONENT | EQUAL TO OR GREATER THAN 0.074 λ |
| Au OR ALLOY CONTAINING Au AS MAIN COMPONENT | EQUAL TO OR GREATER THAN 0.042 λ |
| Cu OR ALLOY CONTAINING Cu AS MAIN COMPONENT | EQUAL TO OR GREATER THAN 0.136 λ |

The second electrode layer 3b is made of Al or an alloy containing Al as a main component. From the viewpoint of reducing resistance of the electrode fingers and further reducing loss, the second electrode layer 3b is preferably made of metal or an alloy having lower resistance than that of the first electrode layer 3a. Therefore, the second electrode layer 3b is preferably made of Al, Cu, or an alloy containing Al or Cu as a main component. In this specification, the term "main component" refers to a component the content of which is equal to or higher than about 50% by weight.

From the viewpoint of reducing the resistance of the electrode fingers and further reducing the loss, it is preferable that the film thickness of the second electrode layer 3b be equal to or greater than about 0.0175λ, for example. It is preferable that the film thickness of the second electrode layer 3b be equal to or less than about 0.2λ, for example.

The IDT electrode 3 may be a multilayer metal film in which another metal is further laminated in addition to the first and second electrode layers 3a and 3b. This another metal described above is not particularly limited and examples thereof include metal such as Ti, NiCr, and Cr and alloys thereof. It is preferable that a metal film made of Ti, NiCr, Cr, or the like be a close contact layer enhancing bonding force between the first electrode layer 3a and the second electrode layer 3b.

The IDT electrode 3 can be formed by, for example, a vapor deposition lift-off method or the like.

The silicon oxide film 6 is provided on the main surface 2a of the piezoelectric substrate 2 so as to cover the IDT electrode 3. The silicon oxide film 6 is made of silicon oxide. From the viewpoint of further improving frequency temperature characteristics, it is preferable that a material forming the silicon oxide film 6 be $SiO_2$.

In a preferred embodiment of the present invention, the silicon oxide film 6 contains hydrogen atoms, hydroxyl groups, or silanol groups. In the elastic wave device 1, the silicon oxide film 6 contains the hydrogen atoms, the hydroxyl groups, or the silanol groups, thus reducing or preventing deterioration in IMD (intermodulation distortion).

The silicon oxide film 6 can be formed by sputtering on the main surface 2a of the piezoelectric substrate 2 on which the IDT electrode 3 has been formed, for example. It is possible to introduce the hydrogen atoms, the hydroxyl groups, or the silanol groups into the silicon oxide film 6 by vaporizing water ($H_2O$) in a vaporizer during film formation by the sputtering and mixing the vaporized water with a sputtering gas. The content of the hydrogen atoms, the hydroxyl groups, or the silanol groups in the silicon oxide film 6 can be adjusted by controlling the vaporization amount, that is, the flow rate of water ($H_2O$) using, for example, a mass flow controller or the like. The vaporization amount of water ($H_2O$) may be controlled by another method.

As the sputtering gas that is mixed with the vaporized water ($H_2O$), Ar, $O_2$ or mixed gas thereof may be used, for example. A sputtering pressure may be, for example, equal to or higher than about 0.03 Pa and equal to or lower than about 1.50 Pa. A substrate heating temperature may be, for example, equal to or higher than about 100° C. and equal to or lower than about 300° C.

In the elastic wave device 1, the piezoelectric substrate 2 is preferably made of $LiNbO_3$ as described above, and θ is within the range of equal to or less than about 32° in Euler Angles (0°±5°, θ, 0°±10°) of the piezoelectric substrate 2. The IDT electrode 3 includes the multilayer metal film with the first electrode layer 3a having a high density as a lower layer. The silicon oxide film 6 covers the IDT electrode 3. Therefore, the elastic wave device 1 is low in loss, is excellent in the frequency temperature characteristics, and hardly generates the spurious in the higher-order mode.

In the elastic wave device 1, since the silicon oxide film 6 contains the hydrogen atoms, the hydroxyl groups, or the silanol groups, the deterioration in the IMD (intermodulation distortion) is reduced or prevented.

In order to confirm that the elastic wave device 1 in the present preferred embodiment is able to reduce or prevent deterioration in the IMD, the following elastic wave resonator was designed.

Piezoelectric substrate 2LiNbO$_3$ substrate, Euler Angles (0°, 30°, 0°).

First electrode layer 3aPt film, film thickness: about 0.085λ

Second electrode layer 3bAl film, film thickness: about 0.082λ

IDT electrode 3 duty ratio: about 0.5

Silicon oxide film 6 $SiO_2$ film containing SiOH groups, film thickness: about 0.40λ

Elastic waves main mode: rayleigh waves

The silicon oxide film 6 was formed by sputtering after the IDT electrode 3 was formed on the piezoelectric substrate 2. To be more specific, water ($H_2O$) vaporized into gas from liquid using a vaporizer was added to mixed gas of Ar and $O_2$ while controlling the flow rate thereof by a mass flow controller. A sputtering pressure was set to about 0.5 Pa, and a substrate heating temperature was set to about 220° C. The results are indicated in FIG. 30.

Figure 30:
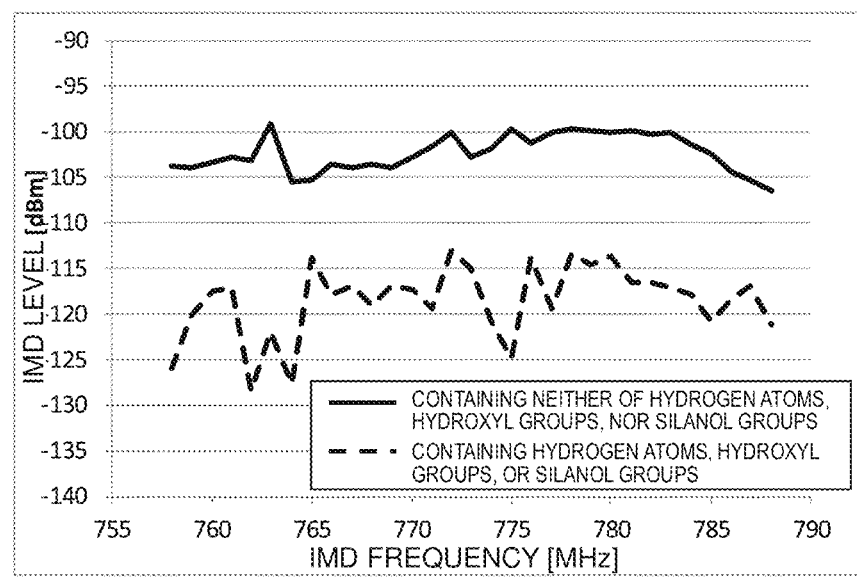
FIG. 30 is a graph illustrating IMD characteristics of the elastic wave device according to a preferred embodiment of the present invention.

FIG. 30 is a diagram illustrating IMD characteristics of the elastic wave device 1 according to the present preferred embodiment of the present invention. In FIG. 30, a broken curve indicates the IMD characteristics when an elastic wave resonator was designed by using the silicon oxide film 6 containing the hydrogen atoms, the hydroxyl groups, or the silanol groups. A solid curve indicates the IMD characteristics when an elastic wave resonator was designed using the silicon oxide film 6 containing neither of the hydrogen atoms, the hydroxyl groups, nor the silanol groups. It is seen from FIG. 30 that the IMD characteristics are improved by using the silicon oxide film 6 containing the hydrogen atoms, the hydroxyl groups, or the silanol groups.

Note that the elastic wave device 1 in the present preferred embodiment, which is low in loss and hardly generates the spurious in the higher-order mode, will be described below with reference to FIG. 3 to FIG. 29.

Figure 3:
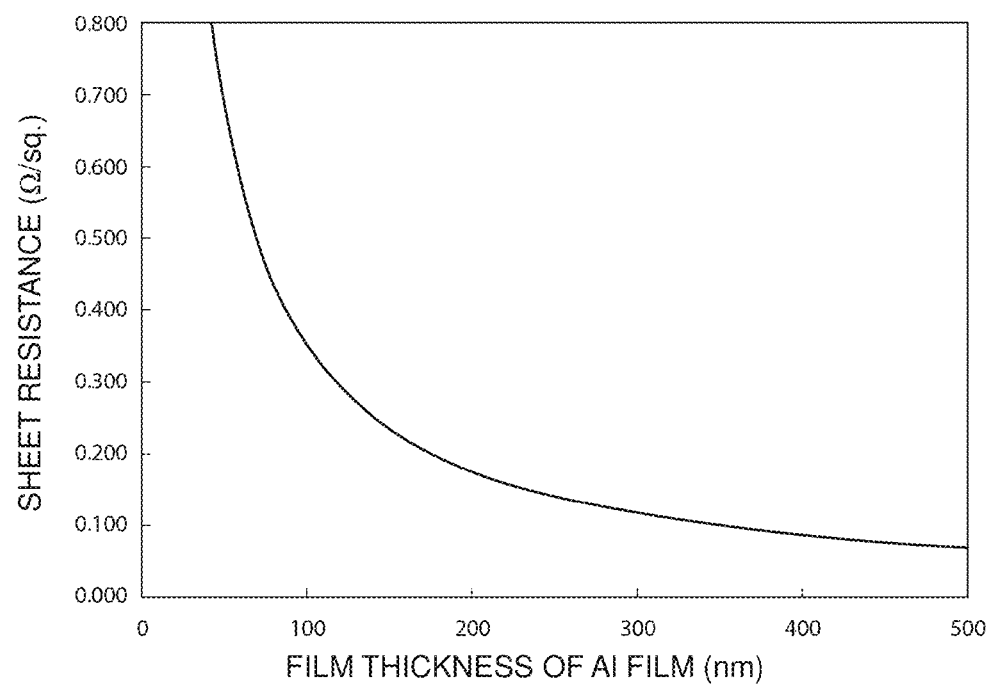
FIG. 3 is a graph illustrating a relationship between the film thickness of an Al film and sheet resistance in a multilayer metal film in which the Al film is laminated on a Pt film.

FIG. 3 is a graph illustrating a relationship between the film thickness of an Al film and sheet resistance in a multilayer metal film in which the Al film is laminated on a Pt film. It can be seen from FIG. 3 that the sheet resistance is decreased with increase in the film thickness of the Al film. The sheet resistance was about 0.5 (Ω/sq.) when the film thickness of the Al film was about 70 nm (about 0.035λ in the case of λ=about 2.0 μm and about 0.0175λ in the case of λ=about 4.0 μm), and about 0.2 (Ω/sq.) when the film thickness of the Al film was about 175 nm (about 0.0875λ in the case of λ=about 2.0 μm and about 0.04375λ in the case of λ=about 4.0 μm). The sheet resistance was about 0.1 (Ω/sq.) when the film thickness of the Al film was about 350 nm (about 0.175λ in the case of λ=about 2.0 μm and about 0.0875λ in the case of λ=about 4.0 μm).

When the above multilayer metal film is used for a device such as the elastic wave device 1, it is desirable to sufficiently reduce the sheet resistance from the viewpoint of reducing loss of the device. Specifically, the sheet resistance is preferably equal to or less than about 0.5 (Ω/sq.), more preferably equal to or less than about 0.2 (Ω/sq.), and still more preferably equal to or less than about 0.1 (Ω/sq.). Therefore, the film thickness of the Al film in the above multilayer metal film is preferably equal to or greater than about 70 nm, more preferably equal to or greater than about 175 nm, and still more preferably equal to or greater than about 350 nm. In order to reduce or prevent deterioration in frequency temperature characteristics, which will be described later, the film thickness of the Al film in the above multilayer metal film is preferably set to equal to or less than about 0.2λ.

Figure 4:
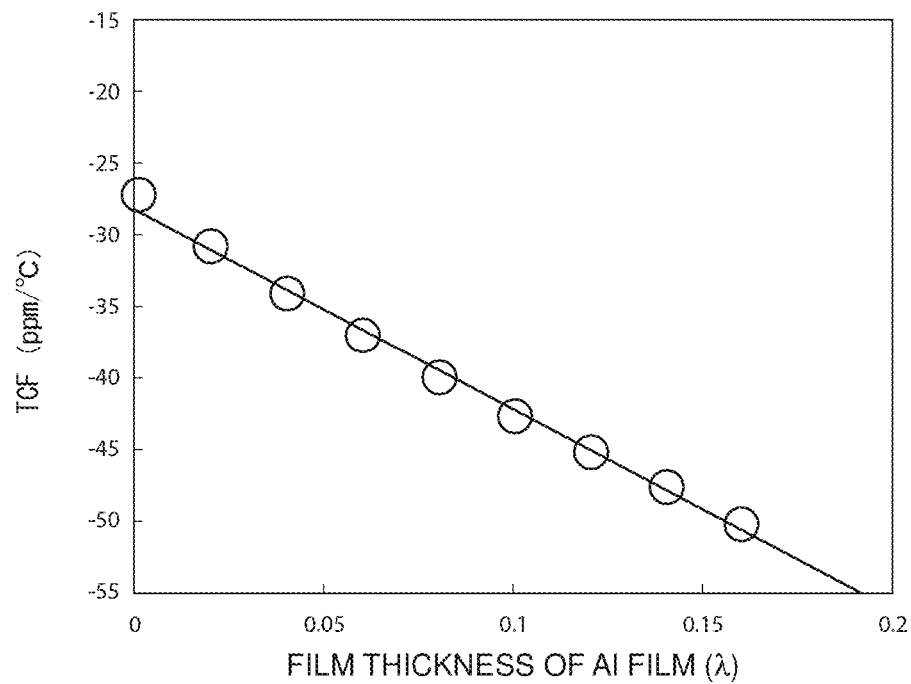
FIG. 4 is a graph illustrating a relationship between the film thickness of the Al film as a second electrode layer and a temperature coefficient of resonant frequency (TCF).

FIG. 4 is a graph illustrating a relationship between the film thickness of the Al film as a second electrode layer and a frequency temperature coefficient (TCF). FIG. 4 illustrates a result when an elastic wave resonator designed as follows was used in the configuration illustrated in FIGS. 1A, 1B, and 2.

Piezoelectric substrate 2LiNbO$_3$ substrate, Euler Angles (0°, 38°, 0°)

First electrode layer 3aPt film, film thickness: about 0.02λ

Second electrode layer 3bAl film

IDT electrode 3 duty ratio: about 0.50

Silicon oxide film 6 $SiO_2$ film, film thickness: about 0.3λ

Elastic waves main mode: rayleigh waves

It can be seen from FIG. 4 that the TCF is deteriorated as the film thickness of the Al film is increased. Specifically, the deterioration amount (ΔTCF) of the TCF relative to the film thickness of the Al film when the wavelength λ is about 2.0 μm (corresponding to the frequency of about 1.8 GHz) is as indicated in Table 3 below. The film thickness of the Al film and the deterioration amount (ΔTCF) of the TCF when the wavelength λ is about 4.0 μm (corresponding to the frequency of about 900 MHz) are as indicated in Table 4 below.

Figure 5:
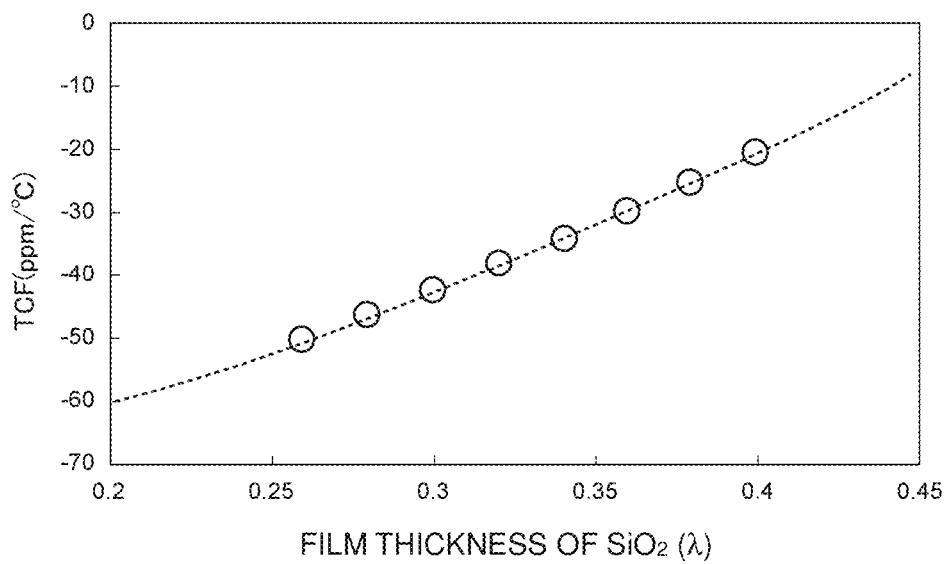
FIG. 5 is a graph illustrating a relationship between the film thickness of a $SiO_2$ film as a silicon oxide film and the temperature coefficient of resonant frequency (TCF).
Figure 6A:
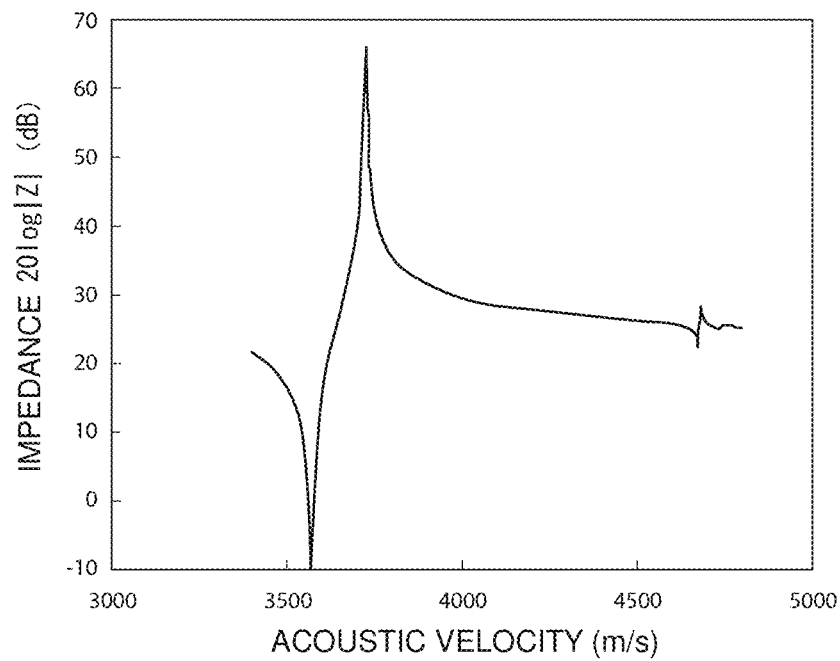
FIG. 6A is a graph illustrating impedance characteristics when the film thickness of $SiO_2$ is about 0.26λ.
Figure 6B:
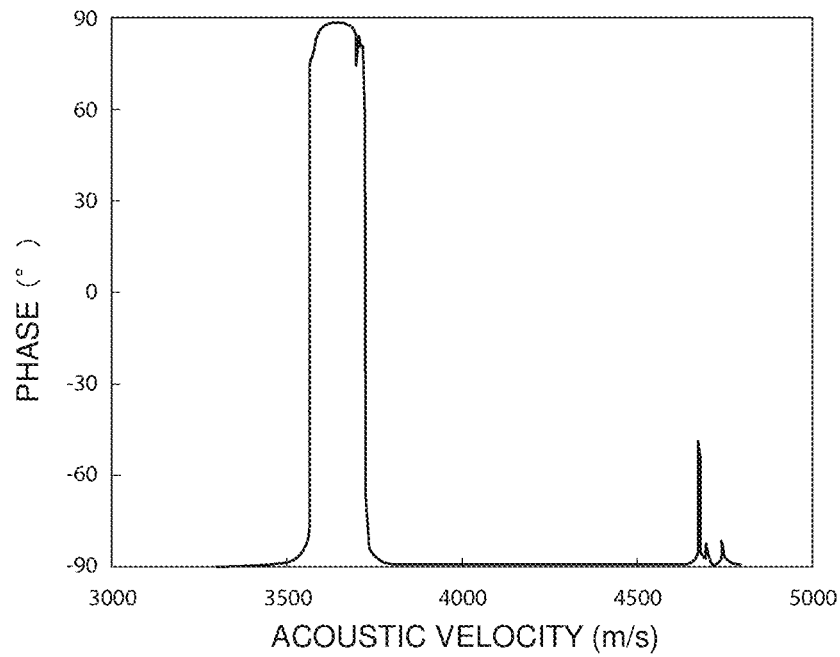
FIG. 6B is a graph illustrating phase characteristics thereof.
Figure 7A:
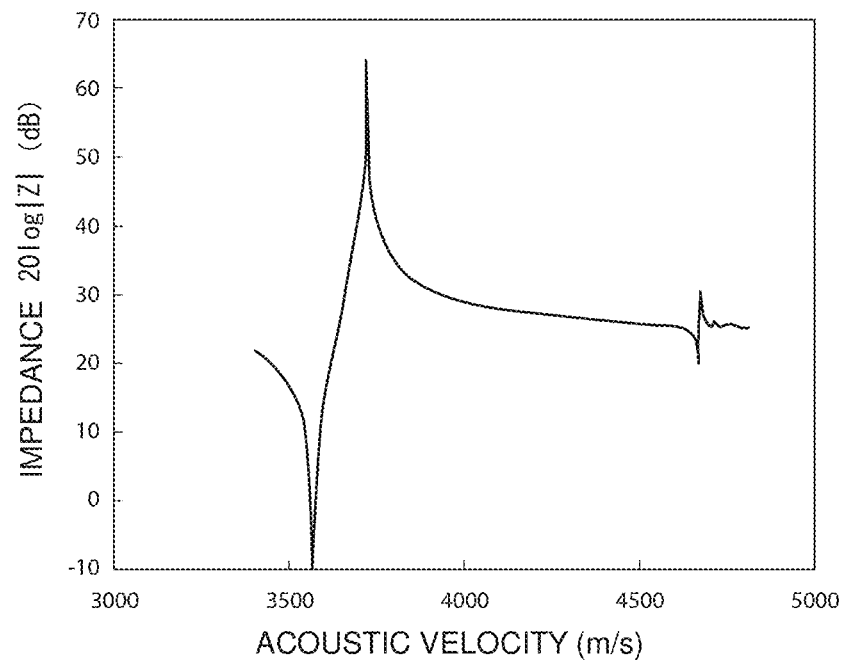
FIG. 7A is a graph illustrating the impedance characteristics when the film thickness of $SiO_2$ is about 0.30λ.
Figure 7B:
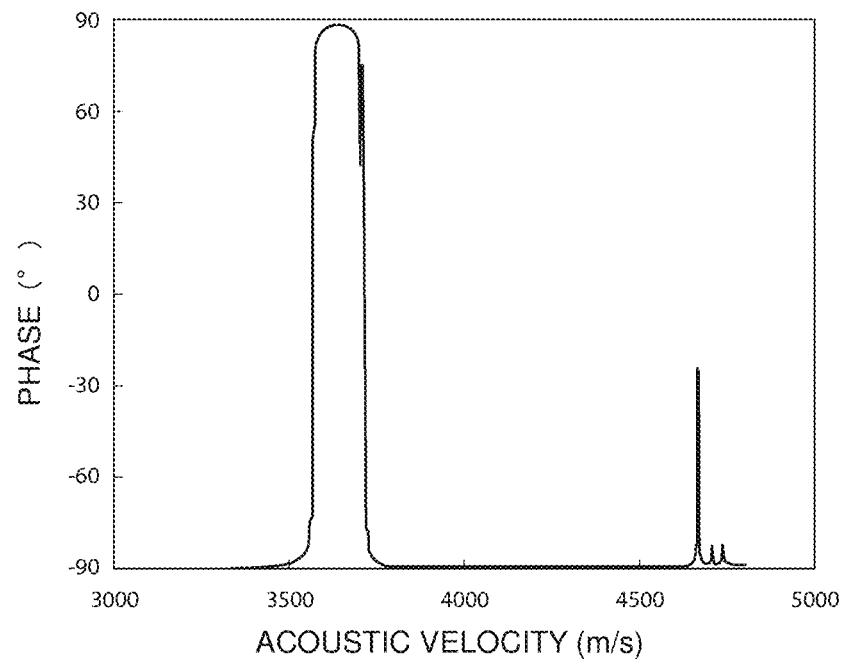
FIG. 7B is a graph illustrating the phase characteristics thereof.
Figure 8A:
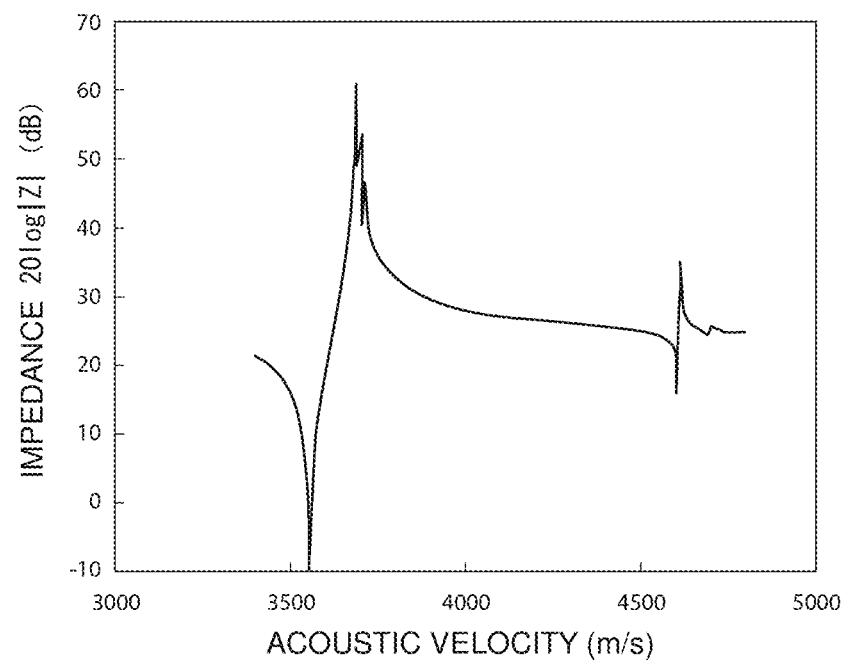
FIG. 8A is a graph illustrating the impedance characteristics when the film thickness of $SiO_2$ is about 0.34λ.
Figure 8B:
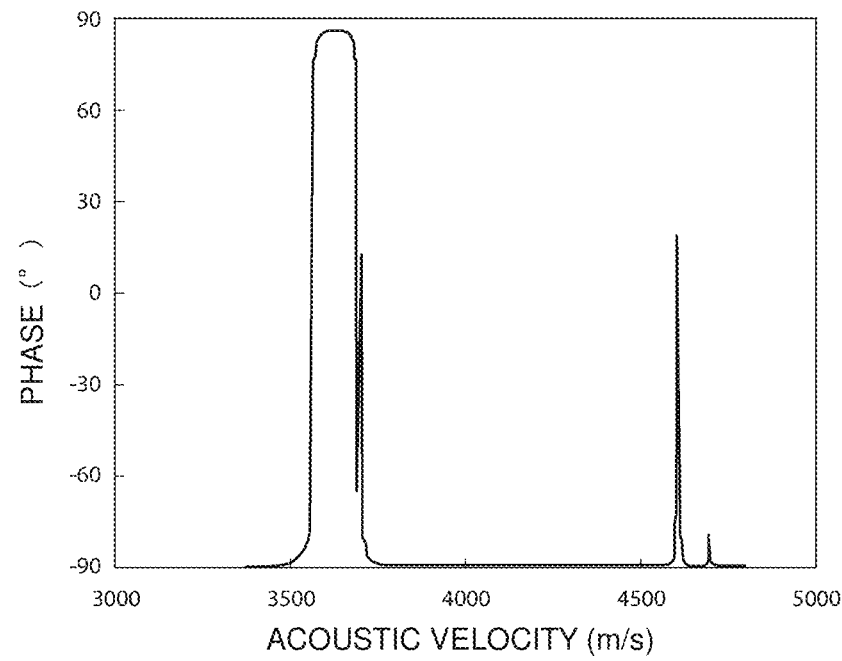
FIG. 8B is a graph illustrating the phase characteristics thereof.
Figure 9A:
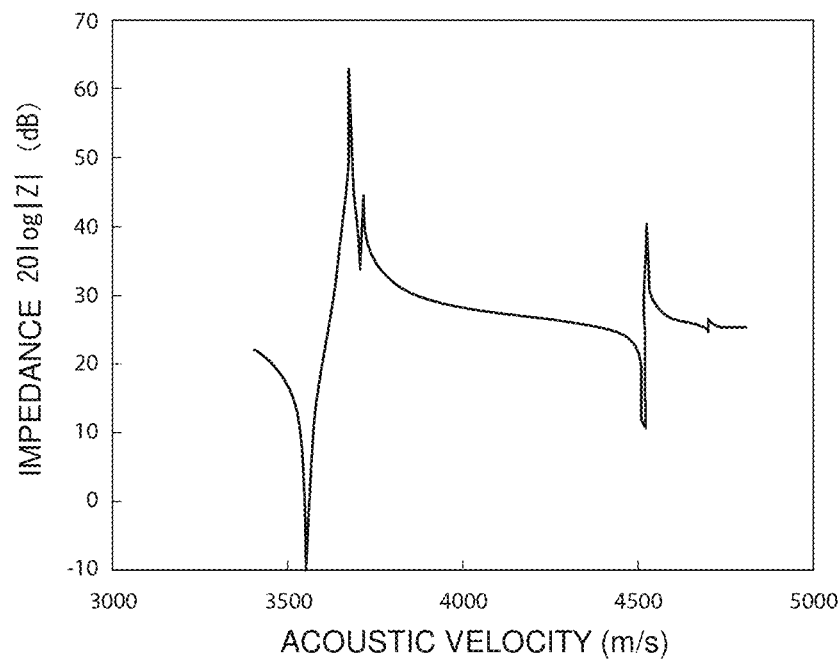
FIG. 9A is a graph illustrating the impedance characteristics when the film thickness of $SiO_2$ is about 0.38λ.
Figure 9B:
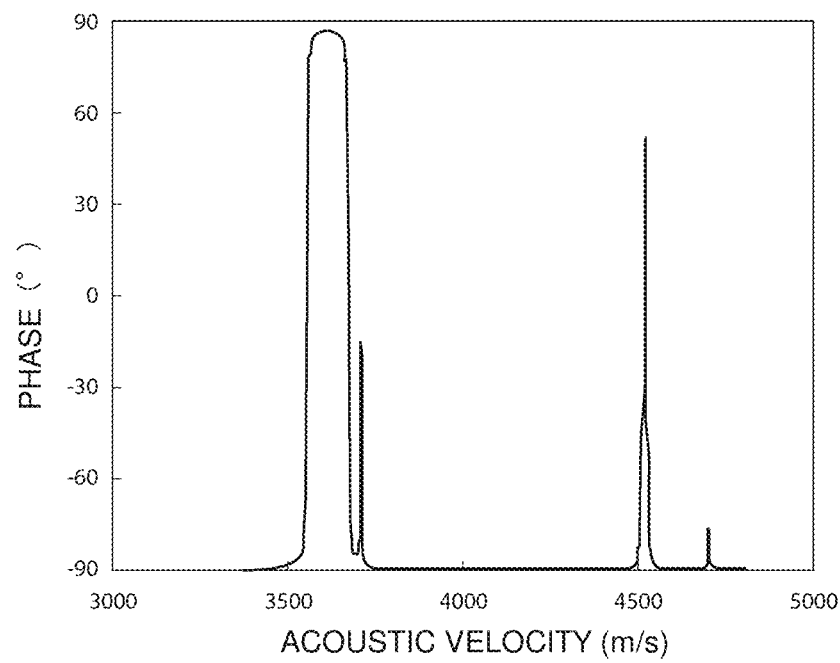
FIG. 9B is a graph illustrating the phase characteristics thereof.

FIG. 5 is a graph illustrating a relationship between the film thickness of the SiO₂ film and the frequency temperature coefficient (TCF). FIG. 5 illustrates a result when an elastic wave resonator designed as follows was used in the configuration illustrated in FIGS. 1A, 1B, and 2.

Piezoelectric substrate 2LiNbO₃ substrate, Euler Angles (0°, 38°, 0°)
First electrode layer 3aPt film, film thickness: about 0.02λ
Second electrode layer 3bAl film, film thickness: about 0.10λ
IDT electrode 3 duty ratio: about 0.50
Silicon oxide film 6: SiO₂ film
Elastic waves main mode: Rayleigh waves As illustrated in FIG. 5, it is seen that the TCF is improved as the film thickness of the SiO₂ film is increased. Based on this relationship, an increase in the film thickness of the SiO₂ film (ΔSiO₂) necessary for compensating for the deterioration of the TCF caused by the addition of the Al film was obtained. The results are indicated in Table 3 and Table 4 below. Table 3 indicates the results for the wavelength λ=about 2.0 μm (corresponding to the frequency of about 1.8 GHz), and Table 4 indicates the results for the wavelength λ=about 4.0 μm (corresponding to the frequency of about 900 MHz).

TABLE 3

| SHEET RESISTANCE [Ω/sq.] | FILM THICKNESS [nm] OF Al FILM | FILM THICKNESS (WAVELENGTH RATIO) [λ] of Al FILM | ΔTCF [ppm/° C.] | ΔSiO₂ (WAVELENGTH RATIO) [λ] |
|---|---|---|---|---|
| | 0 | 0 | 0 | 0 |
| 0.5 | 70 | 0.035 | −5 | 0.023 |
| 0.2 | 175 | 0.0875 | −12.5 | 0.058 |
| 0.1 | 350 | 0.175 | −25 | 0.117 |

TABLE 4

| SHEET RESISTANCE [Ω/sq.] | FILM THICKNESS [nm] OF Al FILM | FILM THICKNESS (WAVELENGTH RATIO) [λ] of Al FILM | ΔTCF [ppm/° C.] | ΔSiO₂ (WAVELENGTH RATIO) [λ] |
|---|---|---|---|---|
| | 0 | 0 | 0 | 0 |
| 0.5 | 70 | 0.0175 | −2.5 | 0.012 |
| 0.2 | 175 | 0.04375 | −6.25 | 0.029 |
| 0.1 | 350 | 0.0875 | −12.5 | 0.028 |

In the case where the Al film is provided to improve the sheet resistance, in order to obtain a sufficient sheet resistance value, the TCF is deteriorated for about equal to or higher than about 10 ppm/° C. and about equal to or lower than about 20 ppm/° C. In order to compensate for the deterioration in the TCF, it is preferable to increase the film thickness of the SiO₂ film by equal to or greater than about 0.05λ and equal to or less than about 0.10λ in terms of the wavelength ratio.

FIGS. 6A, 7A, 8A, and 9A are graphs illustrating a magnitude of impedance when an acoustic velocity expressed by a product of the frequency and the wavelength is changed and FIGS. 6B, 7B, 8B, and 9B are graphs illustrating phase characteristics thereof when the film thickness of the SiO₂ film is changed in each of the drawings. In FIGS. 6A to 9B, values obtained by normalizing the film thickness of the SiO₂ film by the wavelength are about 0.26λ, about 0.30λ, about 0.34λ, and about 0.38λ in order, respectively. FIGS. 6A to 9B illustrate results when an elastic wave resonator designed as follows was used in the configuration illustrated in FIGS. 1A, 1B, and 2.

Piezoelectric substrate 2LiNbO₃ substrate, Euler Angles (0°, 38°, 0°)
First electrode layer 3aPt film, film thickness: about 0.02λ
Second electrode layer 3bAl film, film thickness: about 0.10λ
IDT electrode 3 duty ratio: about 0.50
Silicon oxide film 6 SiO₂ film
Elastic waves main mode: Rayleigh waves It can be seen from FIGS. 6A to 9B that the spurious in the higher-order mode in the vicinity of the acoustic velocity of about 4700 m/s is increased as the film thickness of the SiO₂ film is increased. In order to reduce or prevent deterioration in the characteristics of the overall device due to influences of the higher-order mode, it is preferable to make a maximum phase of the higher-order mode equal to or less than about −25°.

Figure 10:
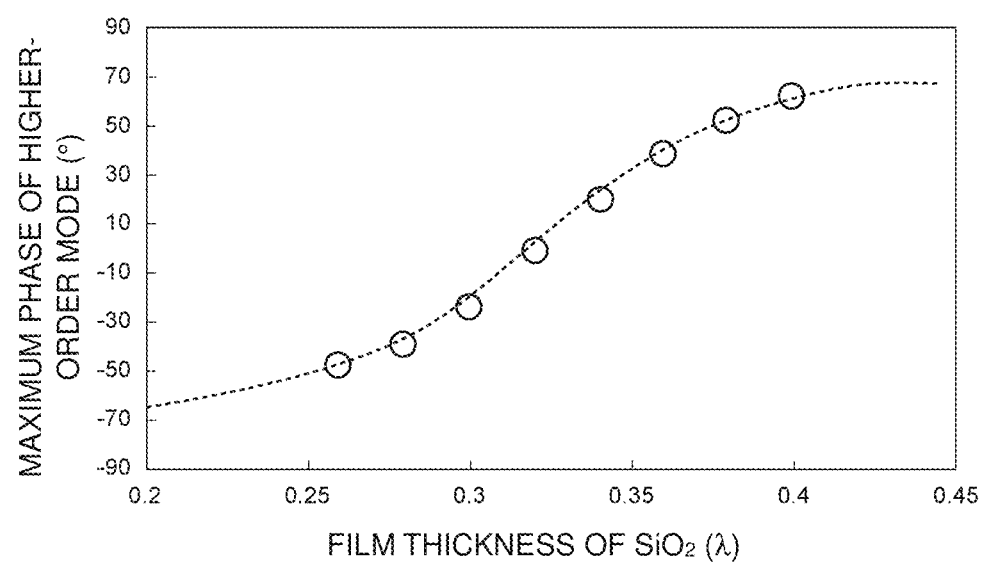
FIG. 10 is a graph illustrating a relationship between the film thickness of the $SiO_2$ film and a maximum phase of a higher-order mode.
Figure 11A:
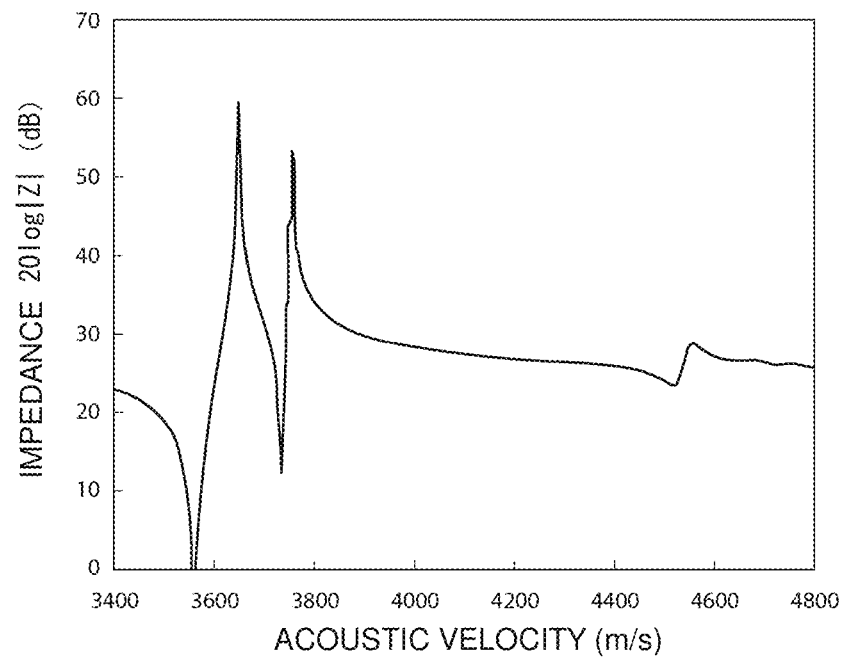
FIG. 11A is a graph illustrating the impedance characteristics when θ=24° in Euler Angles (0°, θ, 0°)
Figure 11B:
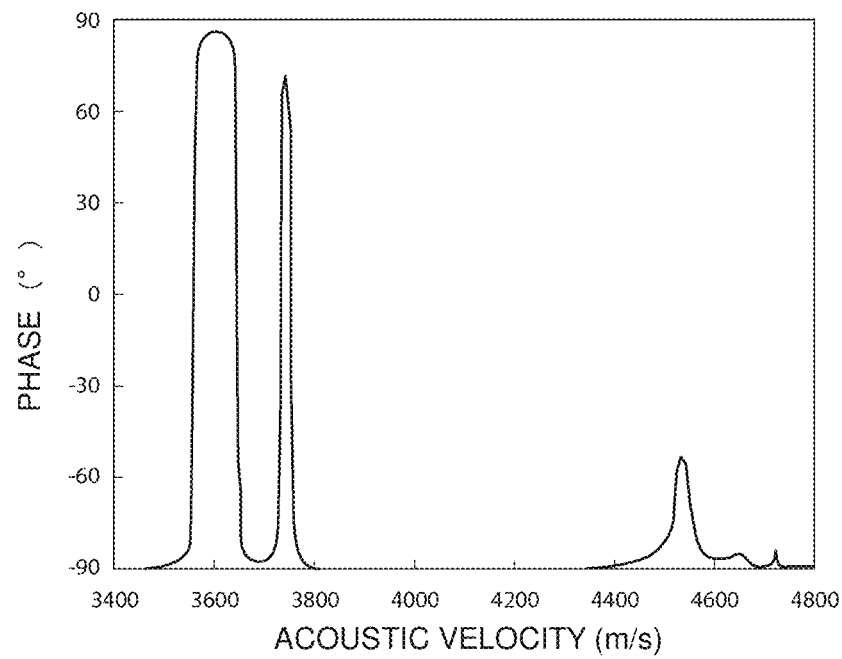
FIG. 11B is a graph illustrating the phase characteristics thereof.
Figure 12A:
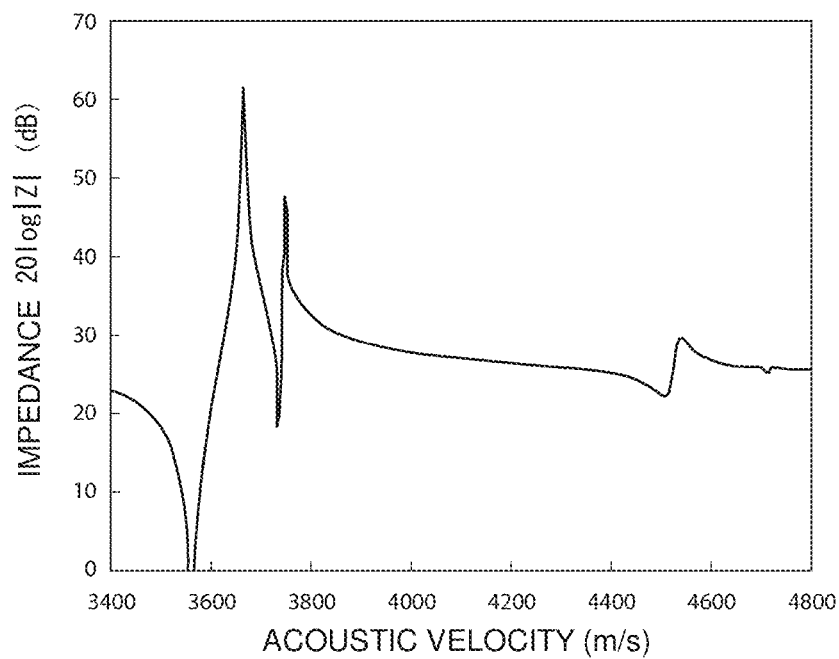
FIG. 12A is a graph illustrating the impedance characteristics when θ=28° in Euler Angles (0°, θ, 0°)
Figure 12B:
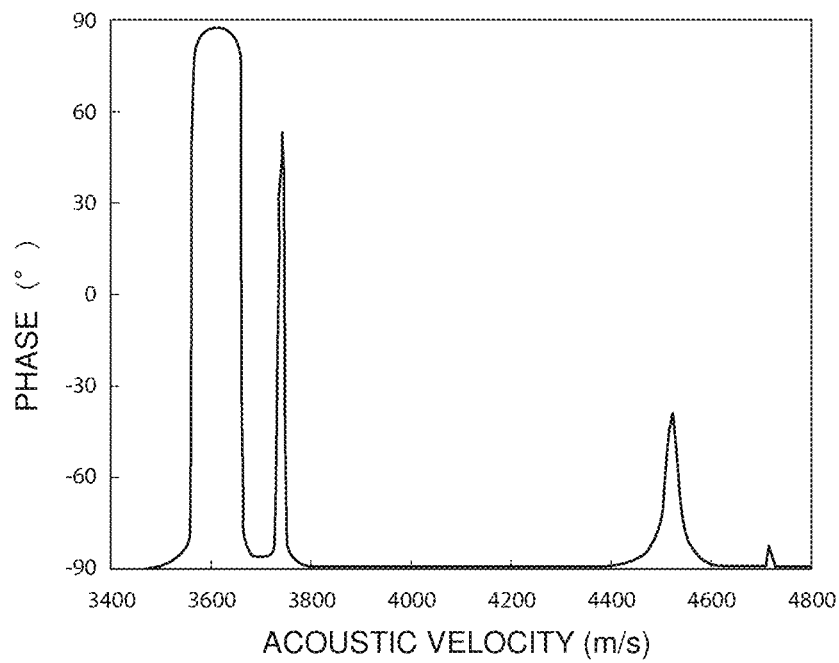
FIG. 12B is a graph illustrating the phase characteristics thereof.
Figure 13A:
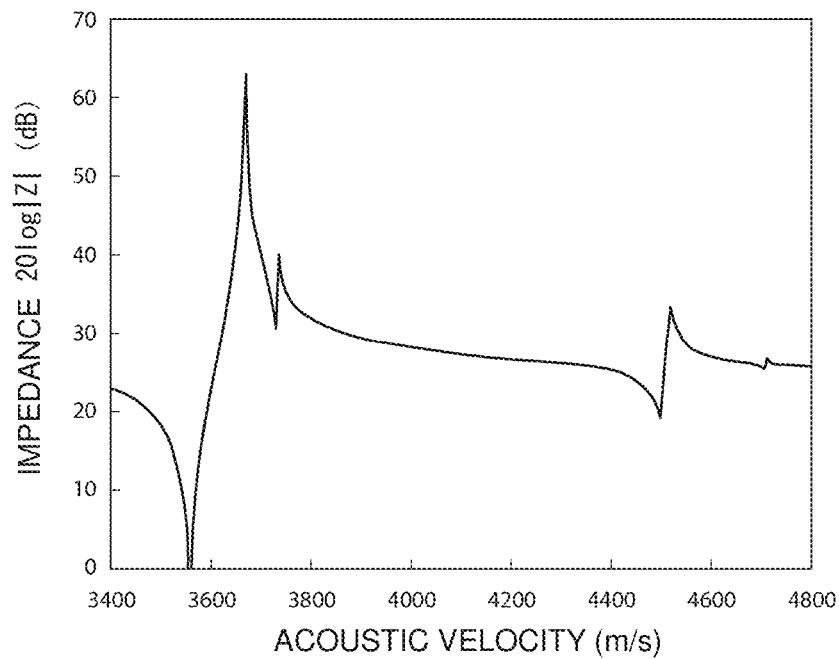
FIG. 13A is a graph illustrating the impedance characteristics when θ=32° in Euler Angles (0°, θ, 0°)
Figure 13B:
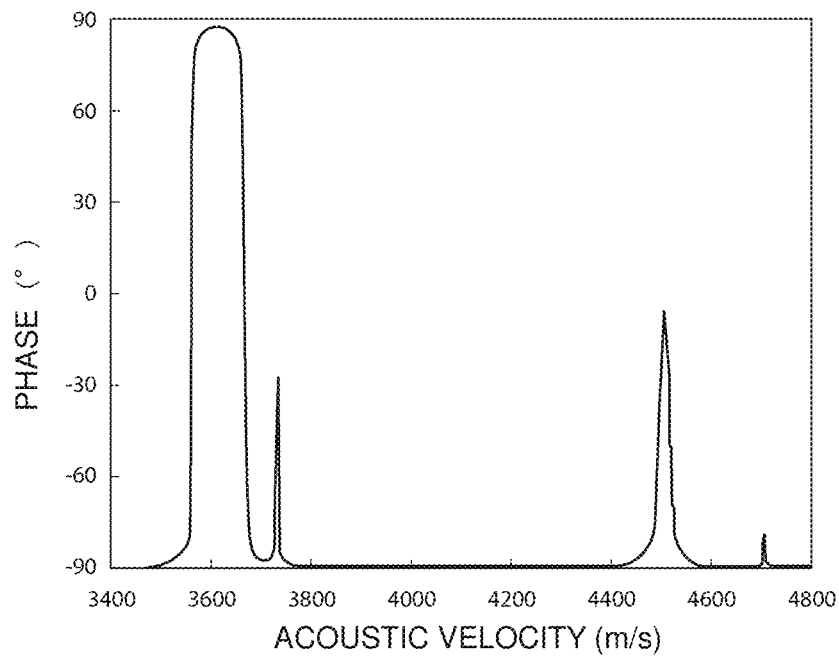
FIG. 13B is a graph illustrating the phase characteristics thereof.
Figure 14A:
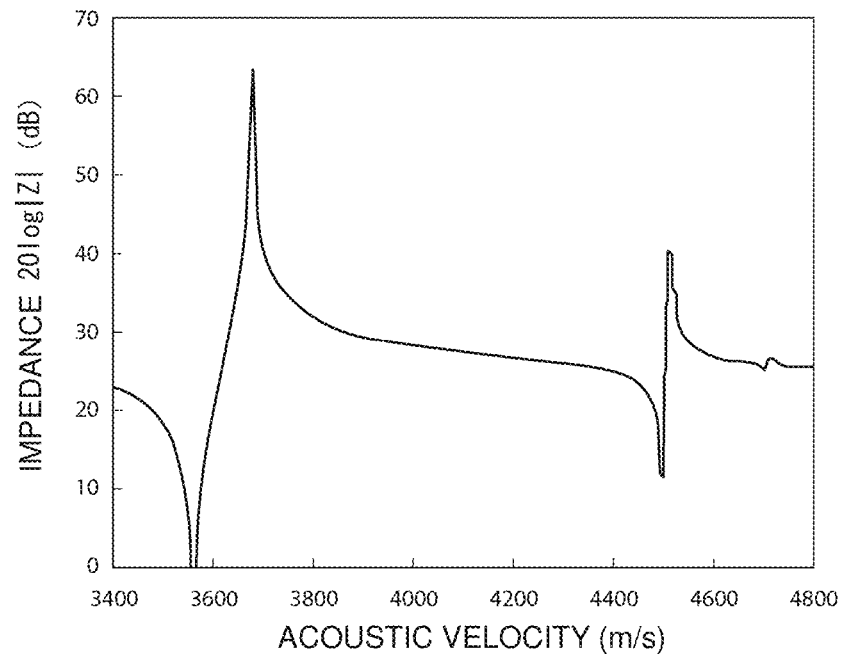
FIG. 14A is a graph illustrating the impedance characteristics when θ=36° in Euler Angles (0°, θ, 0°)
Figure 14B:
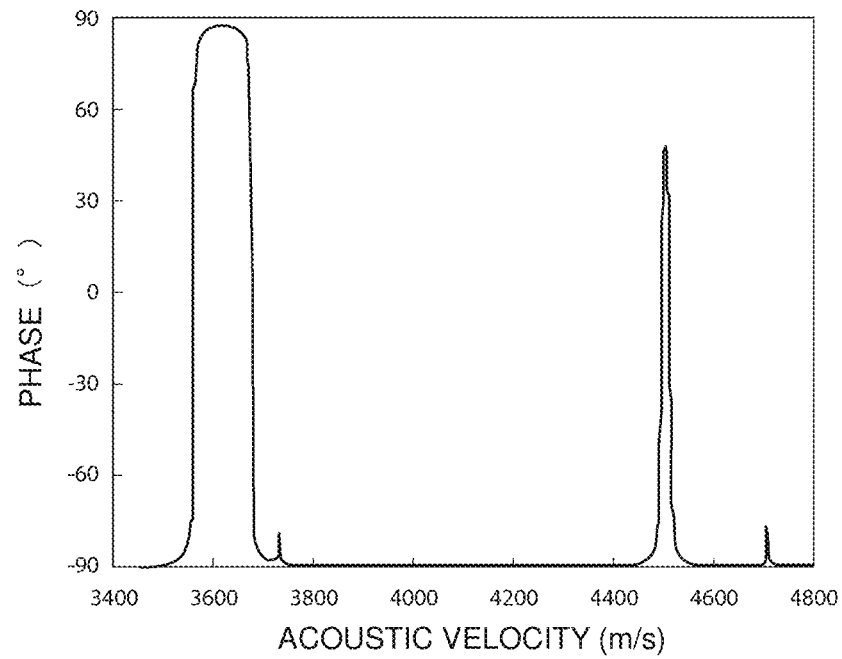
FIG. 14B is a graph illustrating the phase characteristics thereof.
Figure 15A:
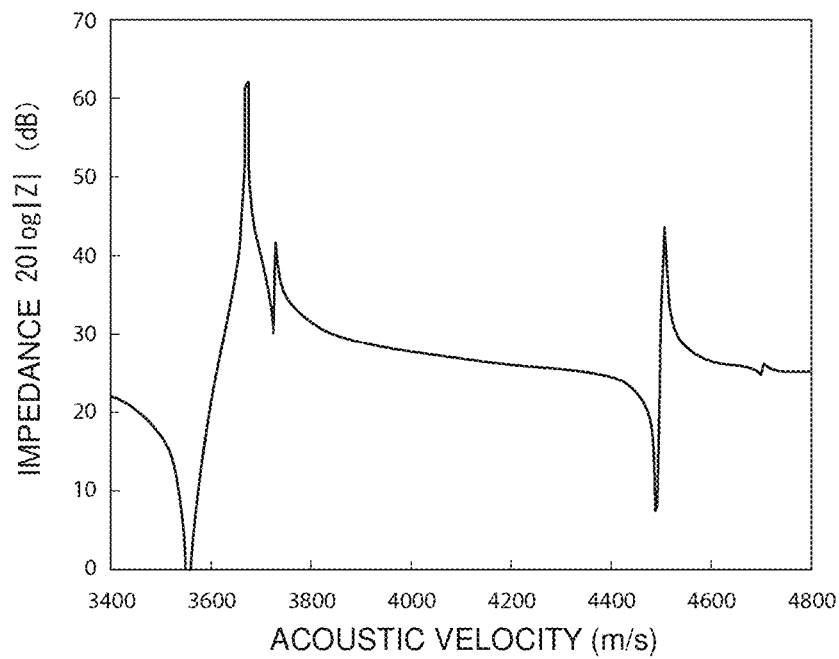
FIG. 15A is a graph illustrating the impedance characteristics when θ=38° in Euler Angles (0°, θ, 0°)
Figure 15B:
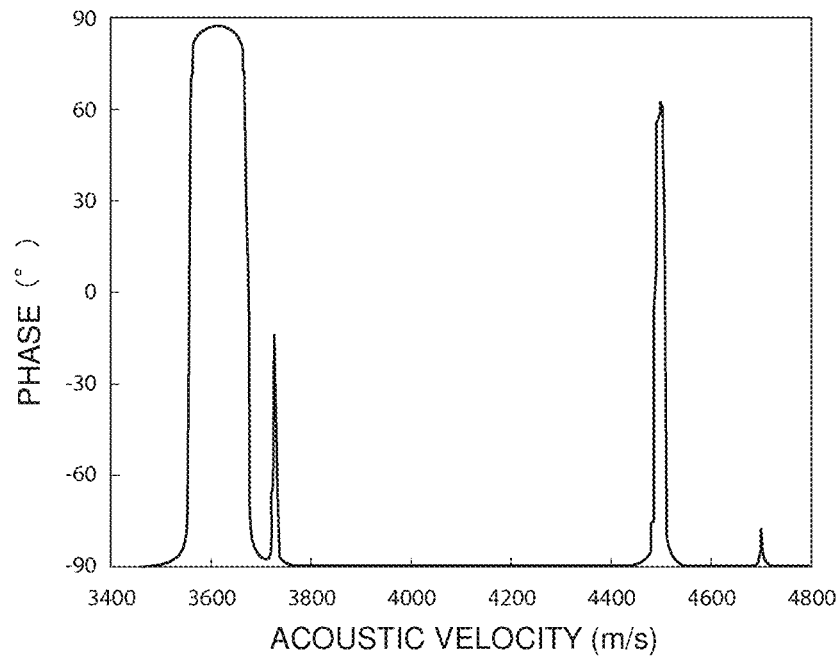
FIG. 15B is a graph illustrating the phase characteristics thereof.

FIG. 10 is a graph illustrating a relationship between the film thickness of the SiO₂ film and the maximum phase of the higher-order mode. FIG. 10 illustrates a result obtained when the elastic wave resonator designed in the same manner as that in FIGS. 6A to 9B was used.

As illustrated in FIG. 10, it is seen that when the film thickness of SiO₂ is equal to or greater than about 0.30λ, the maximum phase of the higher-order mode is greater than about −25°. Therefore, when the SiO₂ film is equal to or greater than about 0.30λ in order to compensate for the deterioration in the TCF due to the addition of the Al film, the higher-order mode is increased and the out-of-band characteristics are deteriorated. Accordingly, it has been impossible to obtain an elastic wave device satisfying all of low loss, improvement in the TCF, and good out-of-band characteristics.

FIGS. 11A, 12A, 13A, 14A and FIG. 15A are graphs illustrating impedance characteristics when θ in Euler Angles (0°, θ, 0°) of the piezoelectric substrate is changed and FIGS. 11B, 12B, 13B, 14B and FIG. 15B are graphs illustrating phase characteristics thereof. In FIGS. 11A to 15B, θ is about 24°, about 28°, about 32°, about 36°, and about 38° in order, respectively. FIGS. 11A to 15B illustrate results when an elastic wave resonator designed as follows was used in the configuration illustrated in FIGS. 1A, 1B, and 2. The following film thicknesses of the electrode layers and the silicon oxide film are normalized by the wavelength λ.

Piezoelectric substrate 2LiNbO₃ substrate, Euler Angles (0°, θ, 0°)
First electrode layer 3aPt film, film thickness: about 0.02λ
Second electrode layer 3bAl film, film thickness: about 0.10λ
IDT electrode 3 duty ratio: about 0.50
Silicon oxide film 6 SiO₂ film, film thickness: about 0.40λ
Elastic waves main mode: Rayleigh waves It can be seen from FIGS. 11A to 15B that the spurious in the higher-order mode is decreased as θ is decreased.

Figure 16:
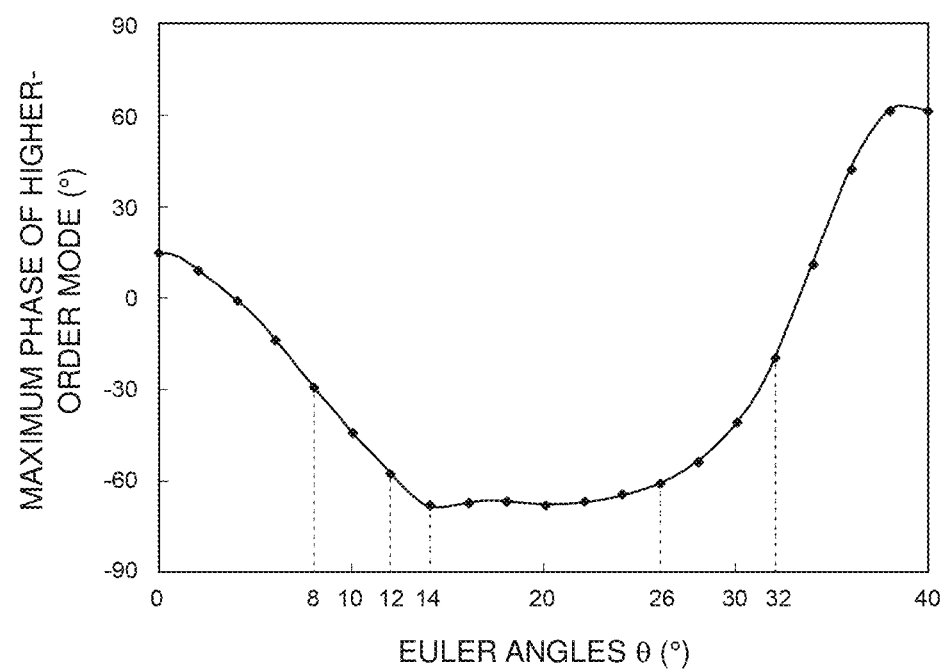
FIG. 16 is a graph illustrating a relationship between θ in Euler Angles (0°, θ, 0°) and the maximum phase of the higher-order mode.

FIG. 16 is a graph illustrating a relationship between θ in Euler Angles (0°, θ, 0°) and the maximum phase of the higher-order mode. FIG. 16 illustrates a result obtained when the elastic wave resonator designed in the same manner as that in FIGS. 11A to 15B was used. It can be seen from FIG. 16 that the maximum phase of the higher-order mode is equal to or less than about −25° when θ is equal to or greater than about 8° and equal to or less than about 32°, for example. That is, it is seen that when θ is equal to or greater than about 8° and equal to or less than about 32°, even if the film thickness of the SiO$_2$ film is thick as much as about 0.40λ, generation of the spurious in the higher-order mode is able to be sufficiently reduced or prevented. Preferably, θ in Euler Angles is equal to or greater than about 12° and equal to or less than about 26°, and in this case, the spurious in the higher-order mode is able to be further reduced or prevented.

In this manner, in addition to the above configuration of the present preferred embodiment, by setting θ in Euler Angles (0°, θ, 0°) to equal to or greater than about 8° and equal to or less than about 32°, it is possible to obtain an elastic wave device satisfying all of the low loss, the improvement in the TCF, and the good out-of-band characteristics.

It is seen from FIGS. 11A to 15B that large spurious is generated in the vicinity of main resonance (around the acoustic velocity of about 3700 m/s) as θ is decreased. This is the spurious due to excitation of SH waves as unwanted waves in addition to the Rayleigh waves as the main mode. This spurious is able to be reduced or prevented by reducing an electromechanical coupling coefficient of the SH waves.

FIGS. 17A to 17C and FIGS. 18A to 18C are graphs illustrating a relationship between θ in Euler Angles (0°, θ, 0°) and the bandwidth ratio of the SH waves when the film thickness of the Pt film is changed. In FIGS. 17A to 17C and FIGS. 18A to 18C, the film thickness of the Pt film is about 0.015λ, about 0.025λ, about 0.035λ, about 0.055λ, about 0.065λ, and about 0.075λ in order, respectively. FIGS. 17A-17C and FIGS. 18A-18C illustrate results when an elastic wave resonator designed as follows was used in the configuration illustrated in FIGS. 1A, 1B, and 2.

Piezoelectric substrate 2 LiNbO$_3$ substrate, Euler Angles (0°, θ, 0°)
First electrode layer 3a Pt film
Second electrode layer 3b Al film, film thickness: about 0.10λ
IDT electrode 3 duty ratio: about 0.50
Silicon oxide film 6 SiO$_2$ film, film thickness: about 0.35λ
Elastic waves main mode: Rayleigh waves The bandwidth ratio (%) was obtained by an equation of bandwidth ratio (%)={(anti-resonant frequency−resonant frequency)/resonant frequency}×100. The bandwidth ratio (%) is proportional to the electromechanical coupling coefficient ($K^2$).

Figure 17A:
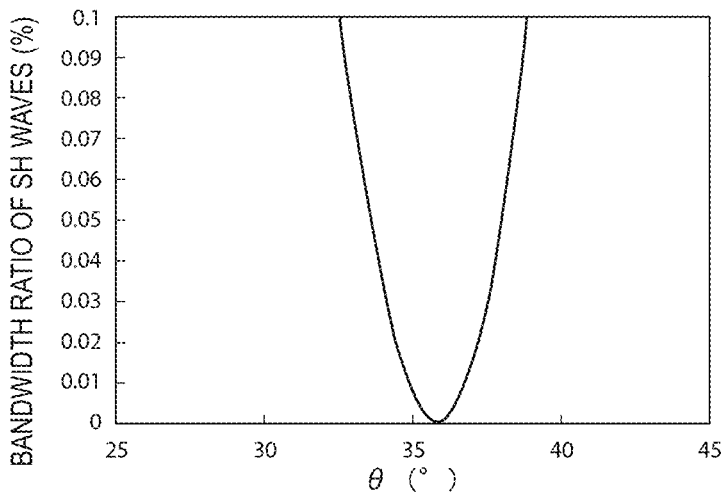
FIGS. 17A to 17C are graphs illustrating a relationship between θ in Euler Angles (0°, θ, 0°) and a bandwidth ratio of SH waves when the film thickness of the Pt film is about 0.015λ, about 0.025λ, and about 0.035λ, respectively.
Figure 17B:
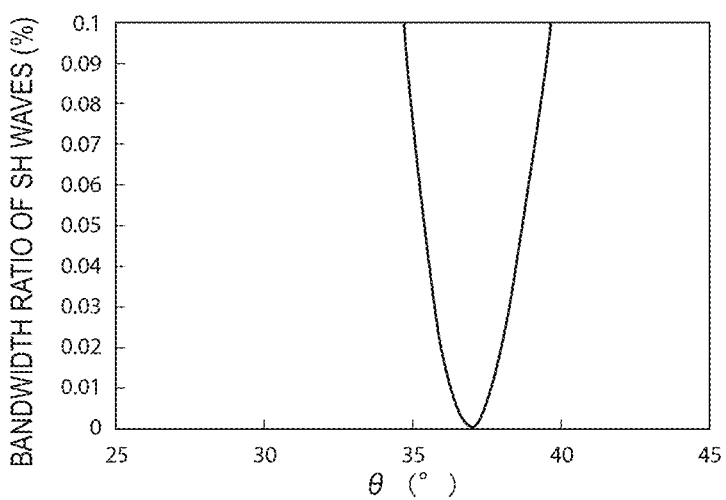
Figure 17C:
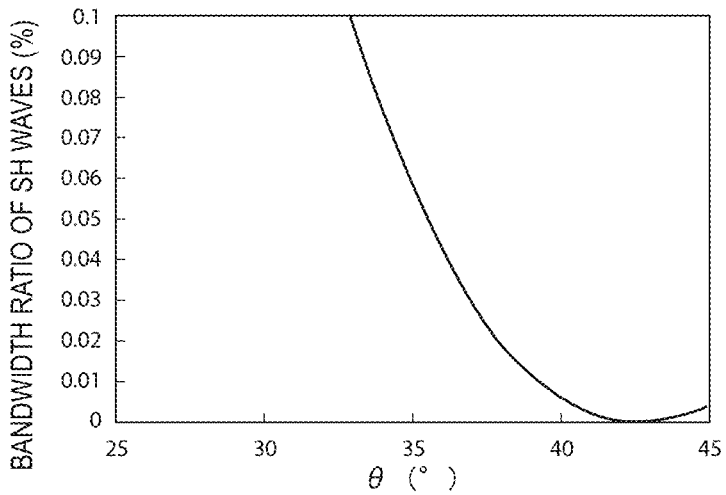
Figure 18A:
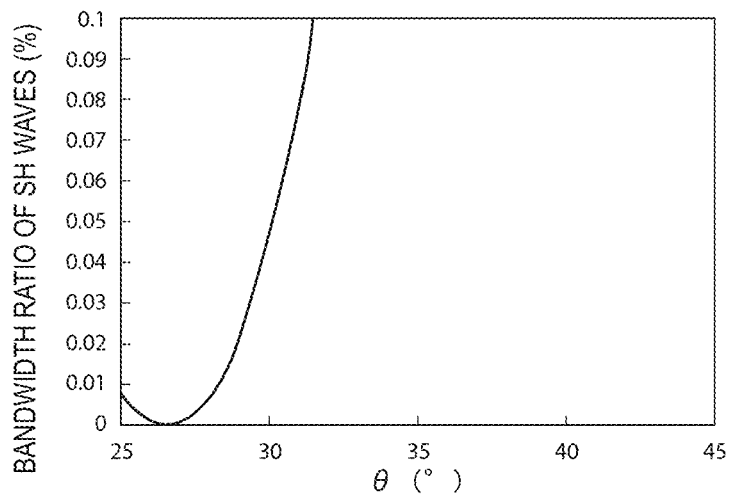
FIGS. 18A to 18C are graphs illustrating the relationship between θ in Euler Angles (0°, θ, 0°) and the bandwidth ratio of the SH waves when the film thickness of the Pt film is about 0.055λ, about 0.065λ, and about 0.075λ, respectively.
Figure 18B:
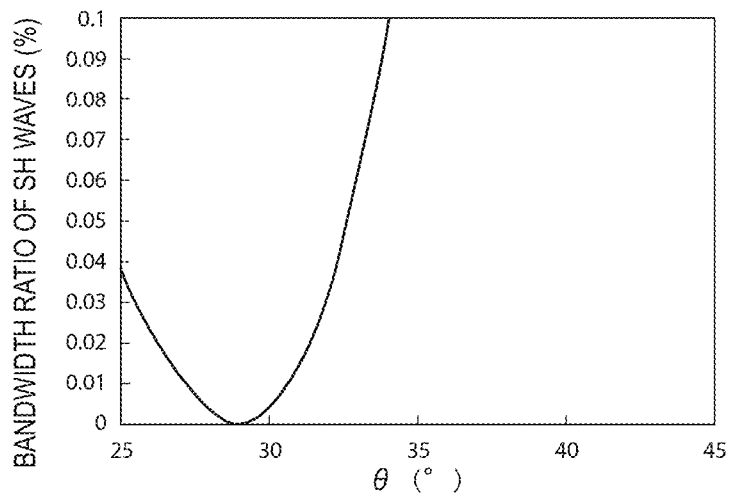
Figure 18C:
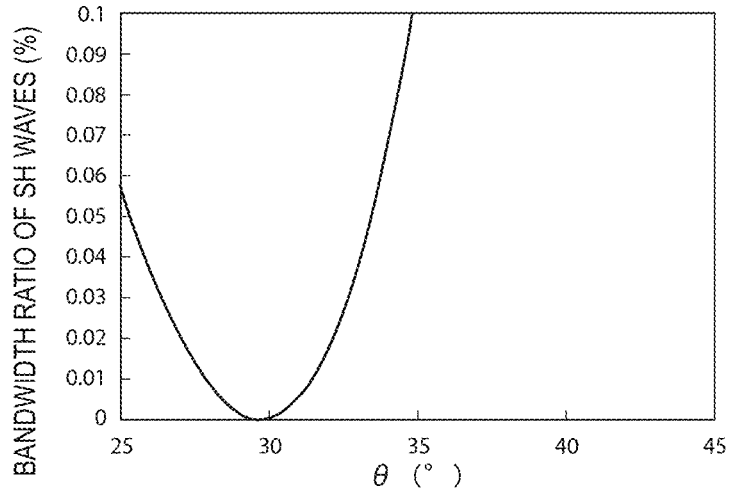

It can be seen from FIGS. 17A to 17C that when the film thickness of the Pt film is in a range of about 0.015λ to about 0.035λ, θ at which the electromechanical coupling coefficient of the SH waves is minimum is increased as the film thickness of the Pt film is increased. On the other hand, as illustrated in FIG. 18A, when the film thickness of the Pt film is about 0.055λ, θ at which the electromechanical coupling coefficient of the SH waves is minimum is reduced to about 27°. It is seen from FIG. 18B that when the film thickness of the Pt film is about 0.065λ, θ is about 29°. Further, it is seen from FIG. 18C that when the film thickness of the Pt film is about 0.075λ, θ is about 30°.

Therefore, it is seen that in order to make Euler Angle θ, which sufficiently reduces or prevents the spurious in the higher-order mode, equal to or less than about 32°, at least the film thickness of the Pt film needs to be greater than about 0.035λ.

The reason why the minimum value of the electromechanical coupling coefficient of the SH waves changes greatly when the film thickness of the Pt film is in the range of about 0.035λ to about 0.055λ can be explained with reference to FIG. 19.

Figure 19:
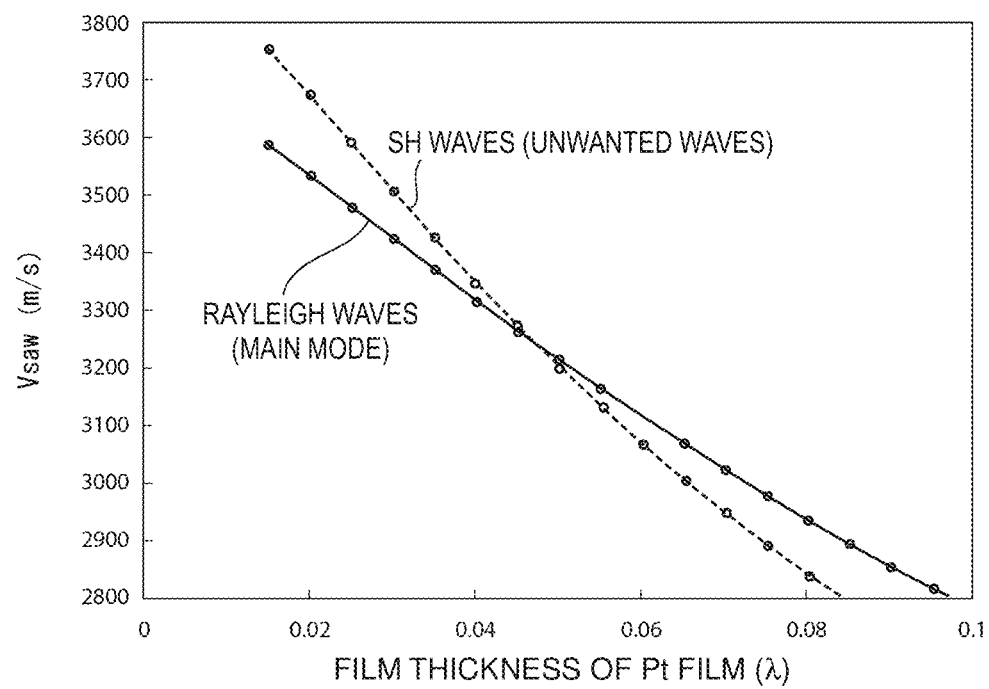
FIG. 19 is a graph illustrating relationships between the film thickness of the Pt film and acoustic velocities of Rayleigh waves and the SH waves.

FIG. 19 is a graph illustrating relationships between the film thickness of the Pt film and acoustic velocities of the Rayleigh waves and the SH waves. In the drawing, a solid curve indicates a result of the Rayleigh waves as the main mode, and a broken curve indicates a result of the SH waves as the unwanted waves. The vertical axis represents the acoustic velocity (Vsaw) (the same applies to FIG. 21 to FIG. 25). FIG. 19 illustrates results when an elastic wave resonator designed as follows was used in the configuration illustrated in FIGS. 1A, 1B, and 2.

Piezoelectric substrate 2 LiNbO$_3$ substrate, Euler Angles (0°, 28°, 0°)
First electrode layer 3a Pt film
Second electrode layer 3b Al film, film thickness: about 0.10λ
IDT electrode 3 duty ratio: about 0.60
Silicon oxide film 6 SiO$_2$ film, film thickness: about 0.35λ
Elastic waves main mode: Rayleigh waves It is seen from FIG. 19 that when the film thickness of the Pt film is less than about 0.047λ, the acoustic velocity of the Rayleigh waves is lower than the acoustic velocity of the Rayleigh waves. On the other hand, it is seen that when the film thickness of the Pt film is equal to or greater than about 0.047λ, the acoustic velocity of the SH waves is lower than the acoustic velocity of the Rayleigh waves. From this result, it can be seen that the acoustic velocity relationship between the SH waves and the Rayleigh waves is changed with the film thickness of the Pt film being about 0.047λ, and θ at which the electromechanical coupling coefficient of the SH waves is minimum is consequently lowered. That is, when the film thickness of the Pt film is equal to or greater than about 0.047λ, θ can be set to equal to or less than about 32° and the electromechanical coupling coefficient of the SH waves is able to be reduced or minimized.

Therefore, in a preferred embodiment of the present invention, the film thickness of the first electrode layer 3a is preferably set such that the acoustic velocity of the SH waves is lower than the acoustic velocity of the Rayleigh waves. Specifically, when the Pt film is used as the first electrode layer 3a, it is preferable that the film thickness of the Pt film be equal to or greater than about 0.047λ. In this case, the electromechanical coupling coefficient of the SH waves is able to be decreased, and generation of the unwanted waves in the vicinity of the pass band (around the acoustic velocity of about 3700 m/s) is able to be reduced or prevented. When the total thickness of the electrodes is increased, the aspect ratio of the electrodes is increased and it becomes difficult to form the electrodes. Therefore, it is desirable that the total thickness of the electrodes including Al is equal to or less than about 0.25, for example.

Figure 21:
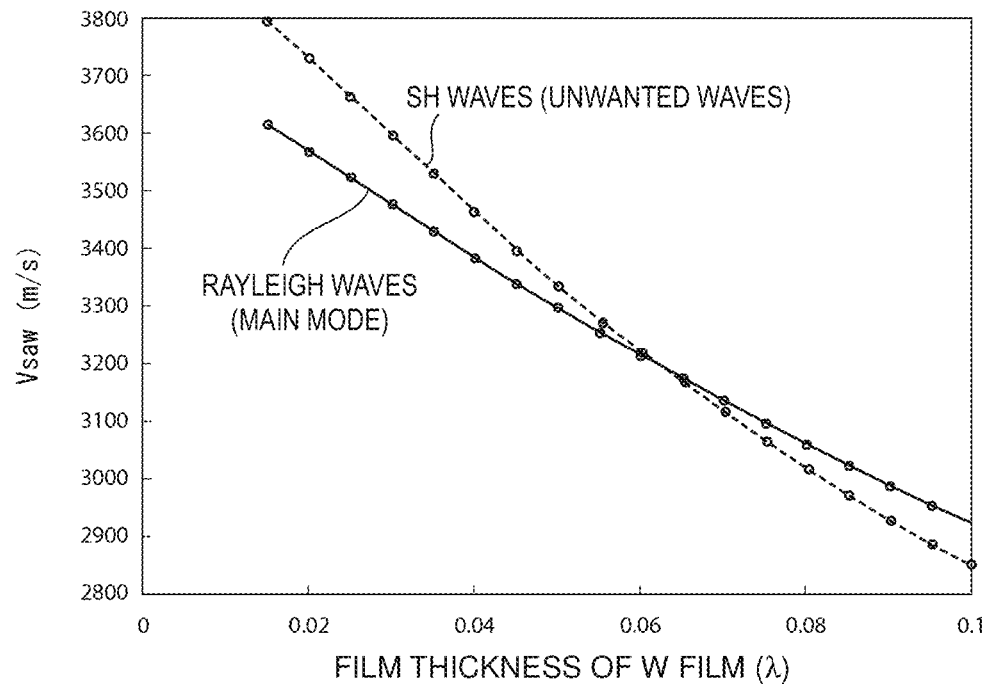
FIG. 21 is a graph illustrating relationships between the film thickness of a W film and the acoustic velocities of the Rayleigh waves and the SH waves.

FIG. 21 is a graph illustrating relationships between the film thickness of a W film and the acoustic velocities of the Rayleigh waves and the SH waves. In the drawing, a solid curve indicates a result of the Rayleigh waves as the main mode, and a broken curve indicates a result of the SH waves as the unwanted waves. FIG. 21 illustrates results obtained when an elastic wave resonator designed in the same manner as that in FIG. 19 other than the point that the W film was formed to have a predetermined thickness as the first electrode layer 3a was used.

It is seen in FIG. 21 that when the W film is used, the acoustic velocity of the Rayleigh waves becomes higher than the acoustic velocity of the SH waves when the film thickness of the W film is about 0.062λ or higher, for example. Therefore, in the case in which the W film is used, when the film thickness of the W film is equal to or greater than about 0.062λ, Euler Angle θ can be set to equal to or less than about 32° and the electromechanical coupling coefficient is able to be reduced or minimized.

Accordingly, when the W film is used as the first electrode layer $3a$, it is preferable that the film thickness of the W film be equal to or greater than about 0.062λ. In this case, the electromechanical coupling coefficient of the SH waves is able to be decreased, and generation of the unwanted waves in the vicinity of the pass band (around the acoustic velocity of about 3700 m/s) is able to be reduced or prevented.

Figure 22:
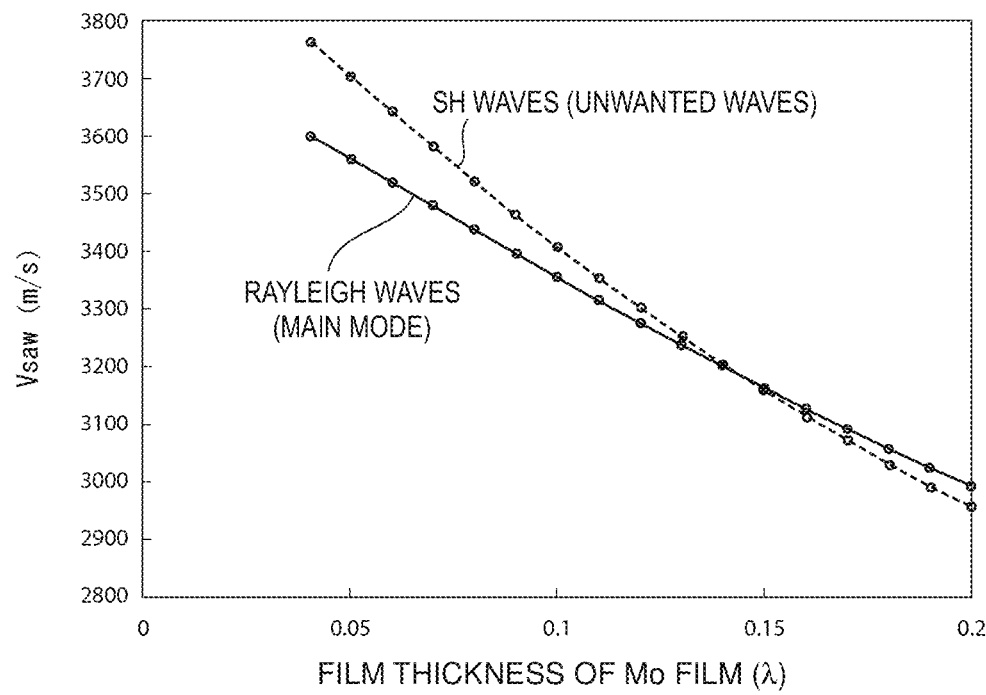
FIG. 22 is a graph illustrating relationships between the film thickness of a Mo film and the acoustic velocities of the Rayleigh waves and the SH waves.

FIG. 22 is a graph illustrating relationships between the film thickness of a Mo film and the acoustic velocities of the Rayleigh waves and the SH waves. In the drawing, a solid curve indicates a result of the Rayleigh waves as the main mode, and a broken curve indicates a result of the SH waves as the unwanted waves. FIG. 22 illustrates results obtained when an elastic wave resonator designed in the same manner as that in FIG. 19 other than the point that the Mo film was formed to have a predetermined thickness as the first electrode layer $3a$ was used.

It is seen in FIG. 22 that when the Mo film is used, the acoustic velocity of the Rayleigh waves becomes higher than the acoustic velocity of the SH waves when the film thickness of the Mo film is about 0.144λ or higher. Therefore, in the case in which the Mo film is used, when the film thickness of the W film is equal to or greater than about 0.144λ, Euler Angle θ can be set to equal to or less than about 32° and the electromechanical coupling coefficient is able to be reduced or minimized.

Accordingly, when the Mo film is used as the first electrode layer $3a$, it is preferable that the film thickness of the Mo film be equal to or greater than about 0.144λ. In this case, the electromechanical coupling coefficient of the SH waves can be decreased, and generation of the unwanted waves in the vicinity of the pass band is able to be reduced or prevented.

Figure 23:
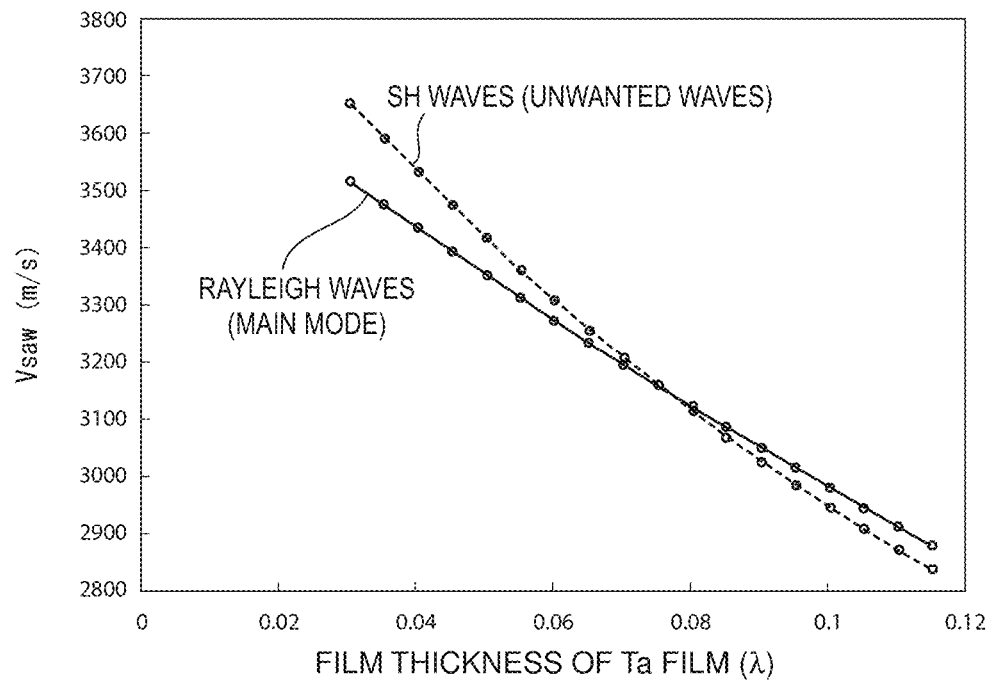
FIG. 23 is a graph illustrating relationships between the film thickness of a Ta film and the acoustic velocities of the Rayleigh waves and the SH waves.

FIG. 23 is a graph illustrating relationships between the film thickness of a Ta film and the acoustic velocities of the Rayleigh waves and the SH waves. In the drawing, a solid curve indicates a result of the Rayleigh waves as the main mode, and a broken curve indicates a result of the SH waves as the unwanted waves. FIG. 23 illustrates a result obtained when the elastic wave resonator designed in the same manner as that in FIG. 19 other than the point that the Ta film was formed to have a predetermined thickness as the first electrode layer $3a$ was used.

It is seen in FIG. 23 that when the Ta film is used, the acoustic velocity of the Rayleigh waves becomes higher than the acoustic velocity of the SH waves when the film thickness of the Ta film is about 0.074λ or higher. Therefore, in the case in which the Ta film is used, when the film thickness of the Ta film is equal to or greater than about 0.074λ, Euler Angle θ can be set to equal to or less than about 32° and the electromechanical coupling coefficient is able to be reduced or minimized.

Accordingly, when the Ta film is used as the first electrode layer $3a$, it is preferable that the film thickness of the Ta film be equal to or greater than about 0.074λ. In this case, the electromechanical coupling coefficient of the SH waves can be decreased, and generation of the unwanted waves in the vicinity of the pass band is able to be reduced or prevented.

Figure 24:
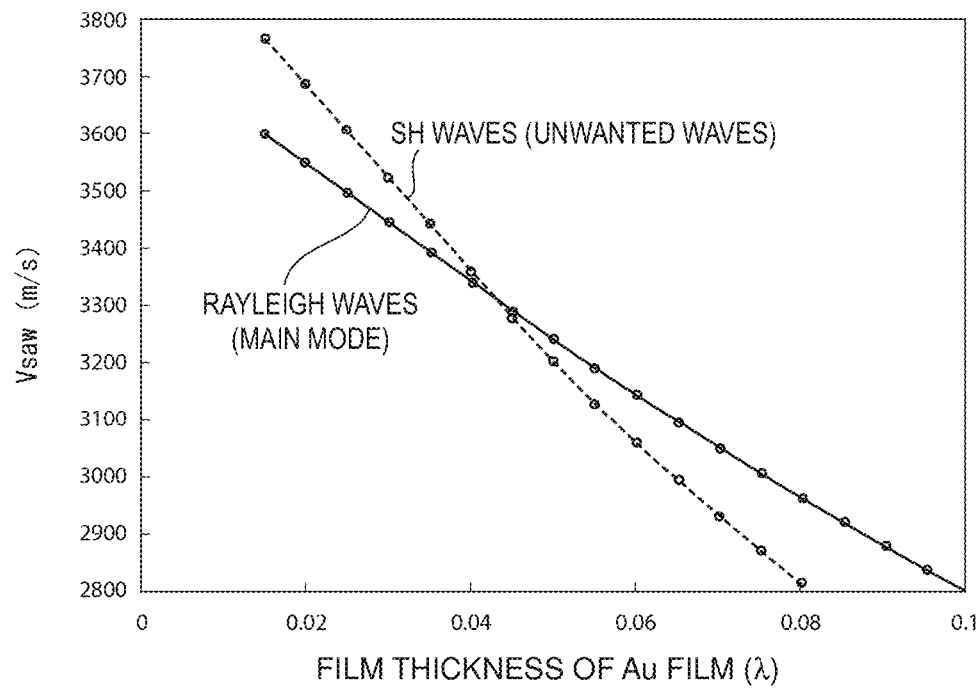
FIG. 24 is a graph illustrating relationships between the film thickness of an Au film and the acoustic velocities of the Rayleigh waves and the SH waves.

FIG. 24 is a graph illustrating relationships between the film thickness of an Au film and the acoustic velocities of the Rayleigh waves and the SH waves. In the drawing, a solid curve indicates a result of the Rayleigh waves as the main mode, and a broken curve indicates a result of the SH waves as the unwanted waves. FIG. 24 illustrates results obtained when an elastic wave resonator designed in the same manner as that in FIG. 19 other than the point that the Au film was formed to have a predetermined thickness as the first electrode layer $3a$ was used.

It is seen from FIG. 24 that when the Au film is used, the higher of the acoustic velocity of the Rayleigh waves and the acoustic velocity of the SH waves changes with the film thickness of the Au film being about 0.042λ. Therefore, in the case in which the Au film is used, when the film thickness of the Au film is equal to or greater than about 0.042λ, Euler Angle θ can be set to equal to or less than about 32° and the electromechanical coupling coefficient is able to be reduced or minimized.

Accordingly, when the Au film is used as the first electrode layer $3a$, it is preferable that the film thickness of the Au film be equal to or greater than about 0.042λ. In this case, the electromechanical coupling coefficient of the SH waves can be decreased, and generation of the unwanted waves in the vicinity of the pass band is able to be reduced or prevented.

Figure 25:
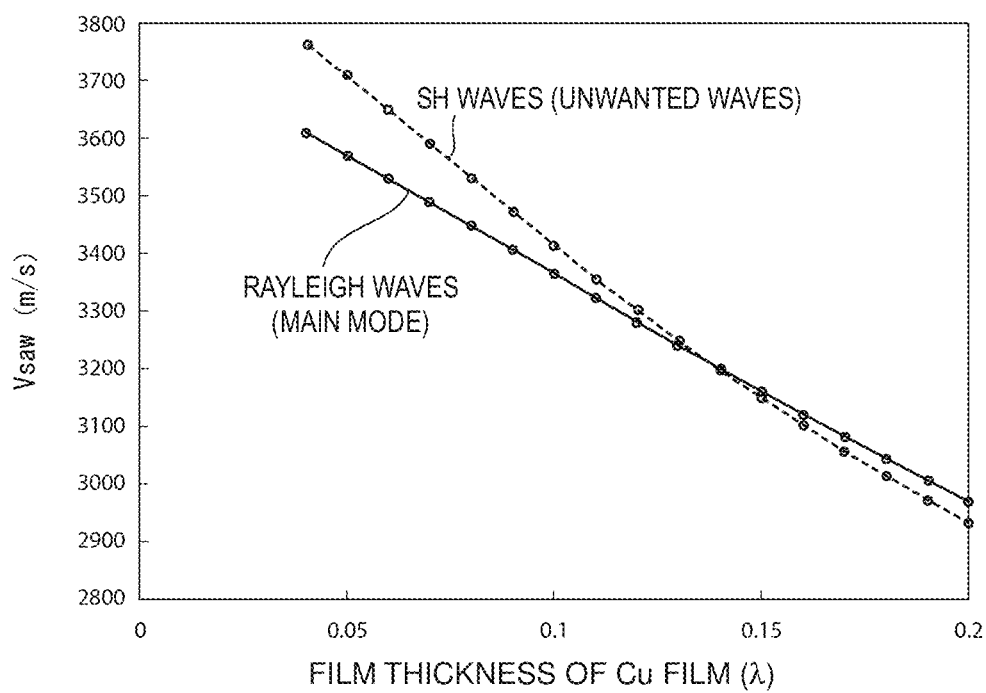
FIG. 25 is a graph illustrating relationships between the film thickness of a Cu film and the acoustic velocities of the Rayleigh waves and the SH waves.

FIG. 25 is a graph illustrating relationships between the film thickness of a Cu film and the acoustic velocities of the Rayleigh waves and the SH waves. In the drawing, a solid curve indicates a result of the Rayleigh waves as the main mode, and a broken curve indicates a result of the SH waves as the unwanted waves. FIG. 25 illustrates results obtained when an elastic wave resonator designed in the same manner as that in FIG. 19 other than the point that the Cu film was formed to have a predetermined thickness as the first electrode layer $3a$ was used.

It is seen in FIG. 25 that when the Cu film is used, the acoustic velocity of the Rayleigh waves becomes higher than the acoustic velocity of the SH waves when the film thickness of the Cu film is about 0.136λ or higher. Therefore, in the case in which the Cu film is used, when the film thickness of the Cu film is equal to or greater than about 0.136λ, Euler Angle θ can be set to equal to or less than about 32° and the electromechanical coupling coefficient is able to be reduced or minimized.

Accordingly, when the Cu film is used as the first electrode layer $3a$, it is preferable that the film thickness of the Cu film be equal to or greater than about 0.136λ. In this case, the electromechanical coupling coefficient of the SH waves can be decreased, and generation of the unwanted waves in the vicinity of the pass band is able to be reduced or prevented.

Figure 26A:
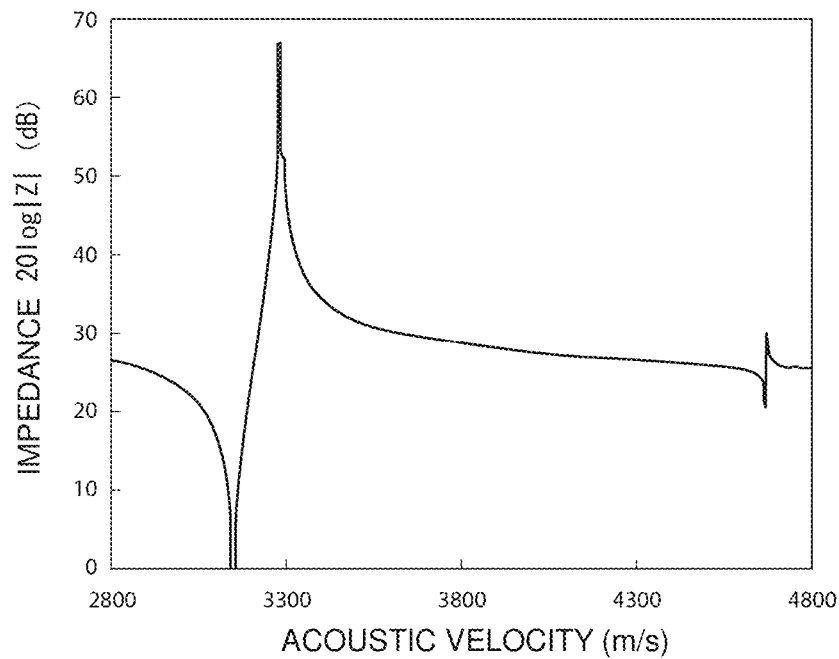
FIG. 26A is a graph illustrating the impedance characteristics when a duty ratio is about 0.50.
Figure 26B:
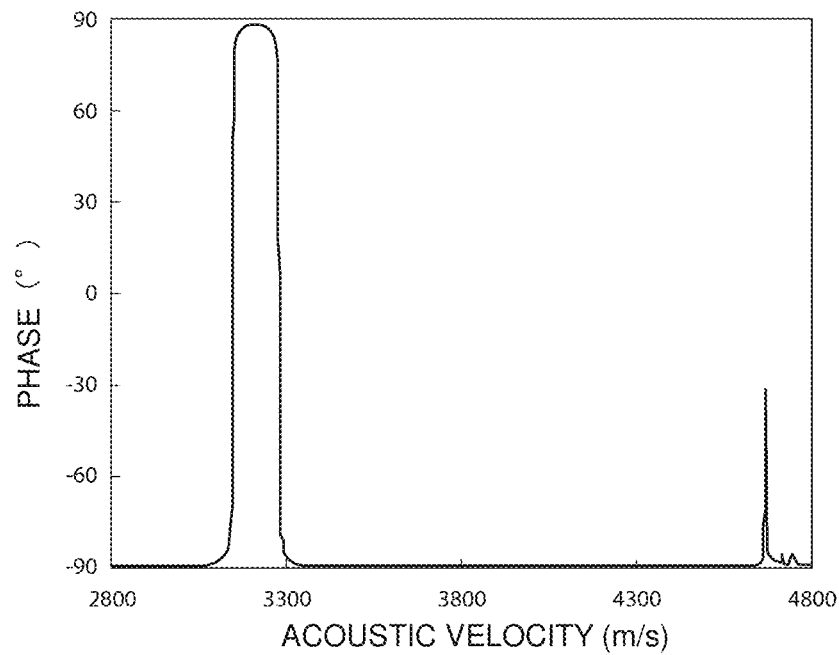
FIG. 26B is a graph illustrating the phase characteristics thereof.
Figure 27A:
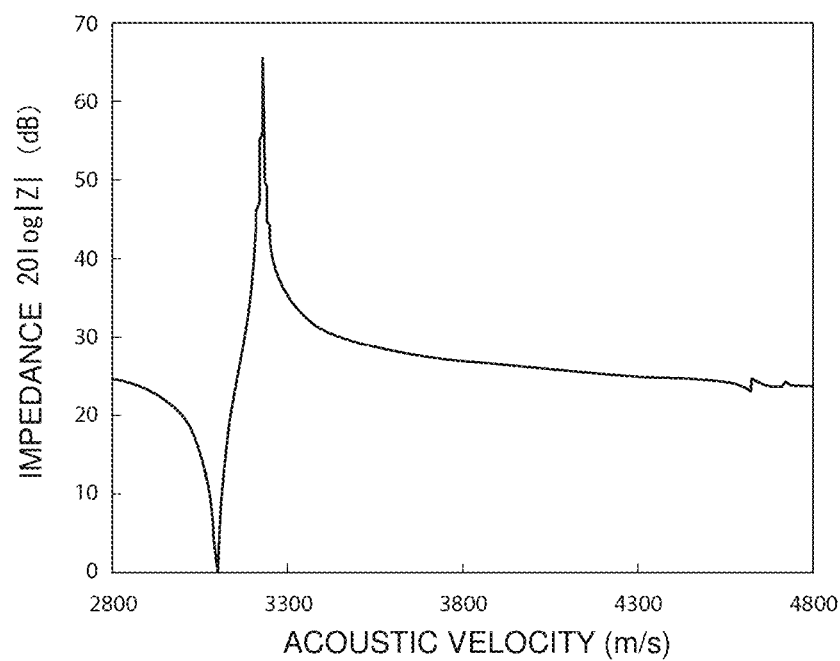
FIG. 27A is a graph illustrating the impedance characteristics when the duty ratio is about 0.60.
Figure 27B:
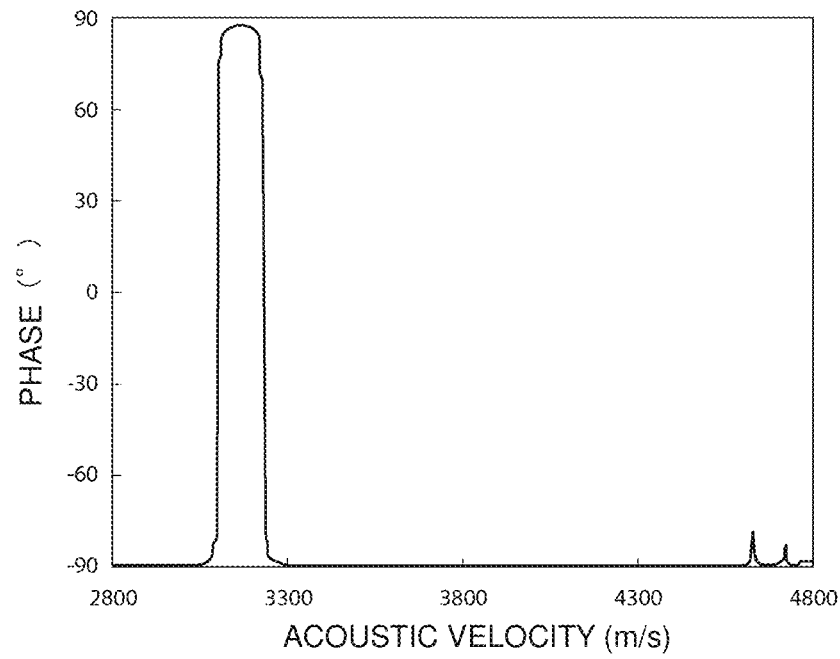
FIG. 27B is a graph illustrating the phase characteristics thereof.
Figure 28A:
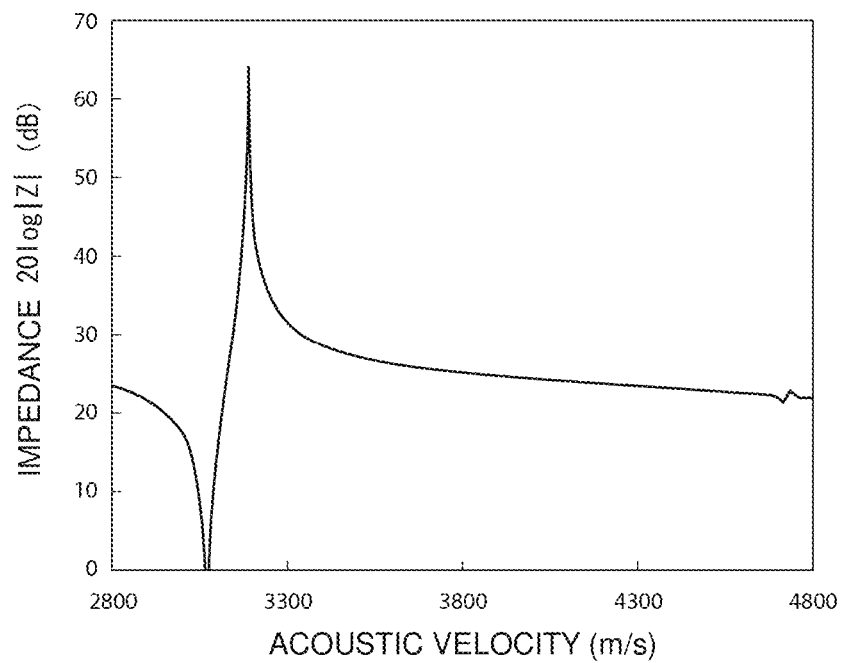
FIG. 28A is a graph illustrating the impedance characteristics when the duty ratio is about 0.70.
Figure 28B:
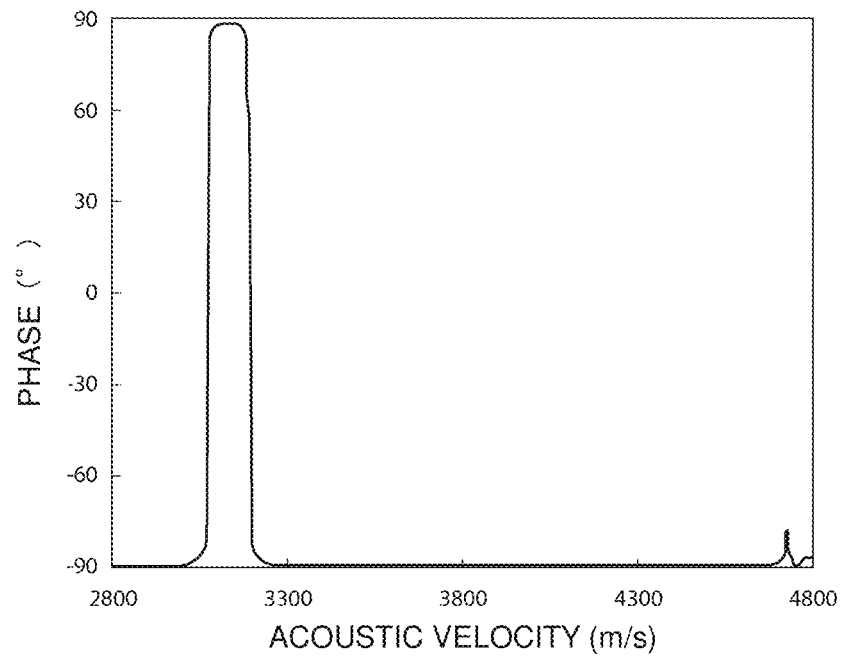
FIG. 28B is a graph illustrating the phase characteristics thereof.

FIGS. 26A, 27A, and FIG. 28A are graphs illustrating impedance characteristics when the duty ratio is changed and FIGS. 26B, 27B, and 28B are graphs illustrating phase characteristics thereof. FIGS. 26A to 28B illustrate results when the duty ratio is about 0.50, about 0.60 and about 0.70 in order, respectively. FIGS. 26A to 28B illustrate results when an elastic wave resonator designed as follows was used in the configuration illustrated in FIGS. 1A, 1B, and 2.

Piezoelectric substrate 2 $LiNbO_3$ substrate, Euler Angles (0°, 28°, 0°)

First electrode layer $3a$ Pt film, film thickness: about 0.06λ

Second electrode layer $3b$ Al film, film thickness: about 0.10λ

Silicon oxide film 6, $SiO_2$ film, film thickness: about 0.32λ

Elastic waves main mode: Rayleigh waves

It can be seen from FIGS. 26A to 28B that the spurious in the higher-order mode is reduced as the duty ratio is increased.

Figure 29:
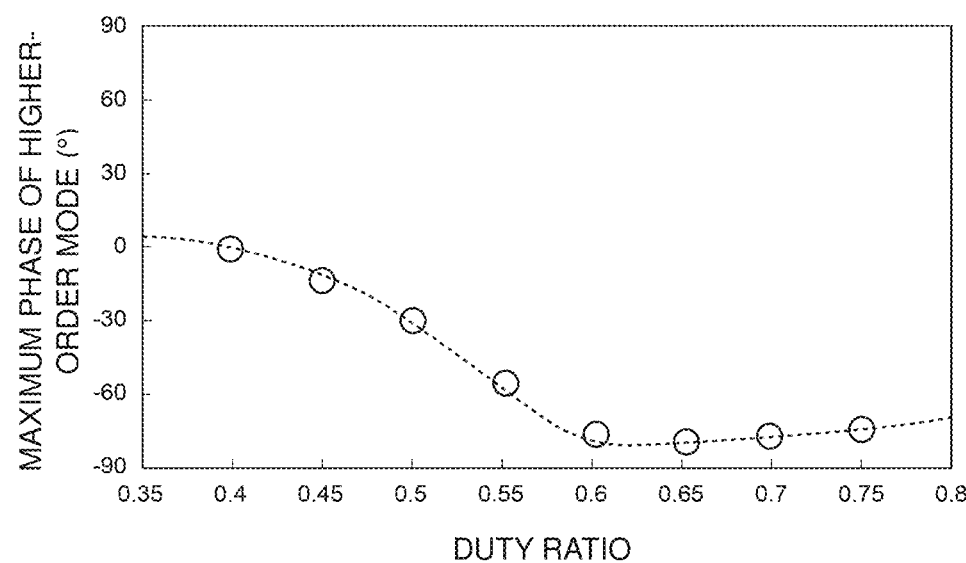
FIG. 29 is a graph illustrating a relationship between the duty ratio of the IDT electrode and the maximum phase of the higher-order mode.

FIG. 29 is a graph illustrating a relationship between the duty ratio of the IDT electrode and the maximum phase of the higher-order mode. FIG. 29 illustrates a result obtained when the elastic wave resonator designed in the same manner as that in FIGS. 26A to 28B was used. It can be seen from FIG. 29 that the maximum phase of the higher-order mode is equal to or less than about −25° when the duty ratio is equal to or higher than about 0.48. It can also be seen that the maximum phase of the higher-order mode is equal to or less than about −60° when the duty ratio is equal to or higher than about 0.55. Therefore, from the viewpoint of further reducing the spurious in the higher-order mode, the duty ratio of the IDT electrode 3 is preferably equal to or higher than about 0.48, and more preferably equal to or higher than about 0.55. Since a gap between the adjacent electrode fingers is decreased as the duty ratio is increased, the duty ratio is desirably equal to or lower than about 0.80.

Then, in view of the above circumstances, the following elastic wave resonator was designed in the configuration illustrated in FIGS. 1A, 1B, and 2.

Piezoelectric substrate 2 LiNbO$_3$ substrate, Euler Angles (0°, 28°, 0°)

First electrode layer 3a Pt film, film thickness: about 0.06λ

Second electrode layer 3b Al film, film thickness: about 0.10λ

IDT electrode 3 duty ratio: about 0.50

Silicon oxide film 6 SiO$_2$ film, film thickness: about 0.40λ

Elastic waves main mode: Rayleigh waves

Figure 20A:
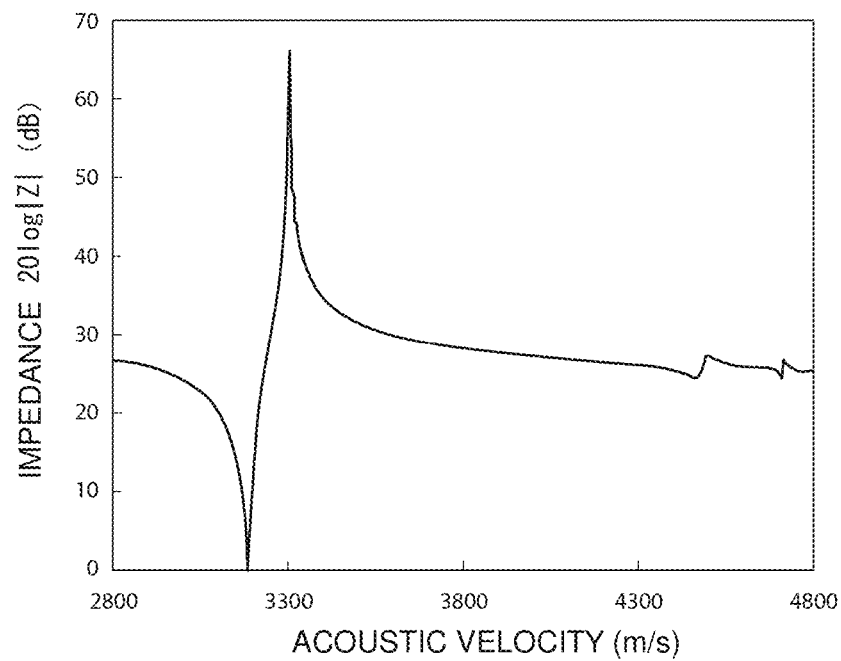
FIG. 20A is a graph illustrating the impedance characteristics of an elastic wave device manufactured in an experimental example.

FIG. 20A is a graph illustrating impedance characteristics of an elastic wave device using the elastic wave resonator designed as described above, and FIG. 20B is a graph illustrating phase characteristics thereof.

Figure 20B:
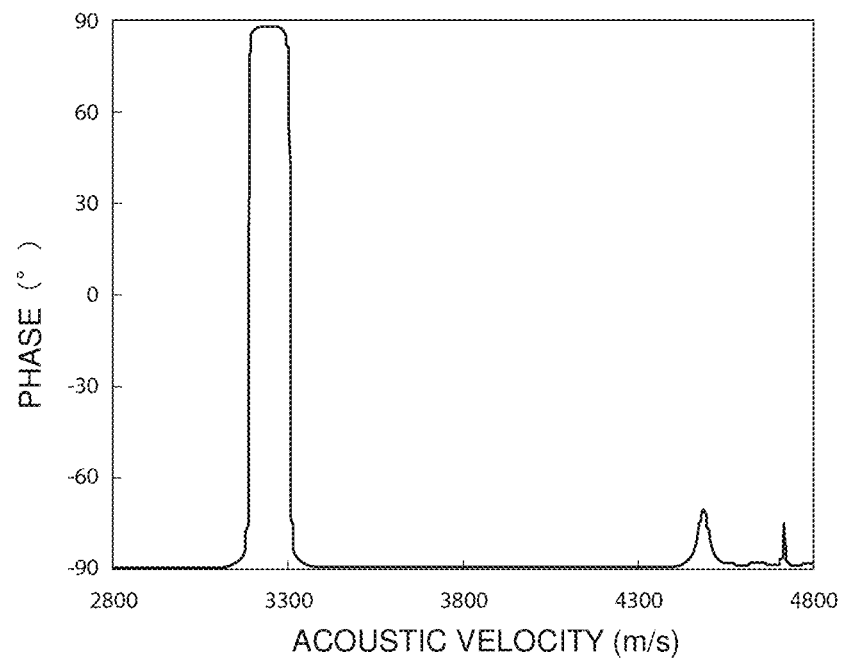
FIG. 20B is a graph illustrating the phase characteristics thereof.

It can be seen from FIGS. 20A and 20B that in the elastic wave device using the elastic wave resonator, spurious in the higher-order mode and spurious of the SH waves are reduced. The elastic wave device using the elastic wave resonator is low in loss because the Al film is sufficiently thick. In the elastic wave device using the elastic wave resonator, the TCF was about −20.7 ppm/° C. and was preferable.

As described above, it was confirmed that the elastic wave device satisfying all of low loss, improvement in the TCF, suppression of the spurious in the higher-order mode, and reduction or prevention of the unwanted waves in the vicinity of the pass band could be manufactured.

Although FIG. 3 to FIG. 29 illustrate the results in the case of Euler Angles (0°, θ, 0°), it has been confirmed that similar results can be obtained even in the range of Euler Angles (0°±5°, θ, 0°±10°).

The following elastic wave resonator was designed in order to confirm that the frequency temperature characteristics could be further improved and the same results could be obtained for the other characteristics also when the silicon oxide film 6 containing the hydrogen atoms, the hydroxyl groups, or the silanol groups was used.

Piezoelectric substrate 2 LiNbO$_3$ substrate, Euler Angles (0°, 30°, 0°)

First electrode layer 3a Pt film, film thickness: about 0.085λ

Second electrode layer 3b Al film, film thickness: about 0.082λ

IDT electrode 3 duty ratio: about 0.50

Silicon oxide film 6 SiO$_2$ film containing the hydrogen atoms, the hydroxyl groups or the silanol groups, film thickness: about 0.40λ

Elastic waves main mode: Rayleigh waves

The silicon oxide film 6 was formed by sputtering after the IDT electrode 3 was formed on the piezoelectric substrate 2. To be more specific, water (H$_2$O) vaporized into gas from liquid using a vaporizer was added to mixed gas of Ar and O$_2$ until an H$_2$O partial pressure in a chamber became about 0.5% to about 20% while controlling the flow rate thereof using a mass flow controller. A sputtering pressure was set to about 0.5 Pa, and a substrate heating temperature was set to about 220° C.

In the designed elastic wave resonator, a TCF, an impedance Z ratio, and a bandwidth ratio were measured. The results are indicated in Table 5. Table 5 also indicates, for comparison, results obtained when the silicon oxide film 6 containing neither of the hydrogen atoms, the hydroxyl groups, nor the silanol groups was used.

TABLE 5

| HYDROGEN ATOMS, HYDROXYL GROUPS, OR SILANOL GROUPS IN SILICON OXIDE FILM | TCF (ppm/° C.) | IMPEDANCE Z RATIO (dB) | BANDWIDTH RATIO (%) |
|---|---|---|---|
| ABSENT | −16.03 | 73.10 | 3.47 |
| PRESENT | −10.22 | 73.35 | 3.45 |

From the results indicated in Table 5, it is seen that even when the silicon oxide film 6 contains the hydrogen atoms, the hydroxyl groups, or the silanol groups, it is possible to obtain an elastic wave resonator which is low in loss, is excellent in the frequency temperature characteristics, and hardly generates the spurious in the higher-order mode.

Elastic wave devices according to the above-described preferred embodiments can be used as a duplexer of a high-frequency front end circuit, and the like. Such an example will be described below.

Figure 31:
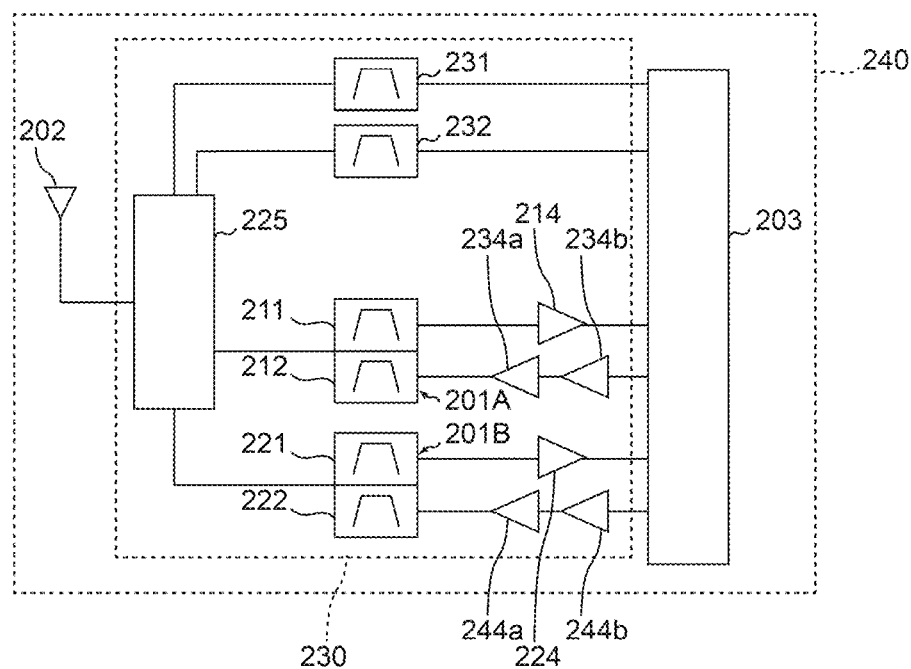
FIG. 31 is a configuration diagram of a communication apparatus and a high-frequency front end circuit according to a preferred embodiment of the present invention.

FIG. 31 is a configuration diagram of a communication apparatus and the high-frequency front end circuit. In FIG. 31, components connected to a high-frequency front end circuit 230, for example, an antenna element 202 and an RFIC (RF signal processing circuit) 203 are also illustrated. The high-frequency front end circuit 230 and the RF signal processing circuit 203 define a communication apparatus 240. The communication apparatus 240 may include a power supply, a CPU (central processing unit), and a display.

The high-frequency front end circuit 230 includes a switch 225, duplexers 201A and 201B, filters 231 and 232, low-noise amplifier circuits 214 and 224, and power amplifier circuits 234a, 234b, 244a and 244b. Note that the high-frequency front end circuit 230 and the communication apparatus 240 illustrated in FIG. 31 are examples of the high-frequency front end circuit and the communication apparatus, and they are not limited to these configurations.

The duplexer 201A includes filters 211 and 212. The duplexer 201B includes filters 221 and 222. The duplexers 201A and 201B are connected to the antenna element 202 with the switch 225 interposed therebetween. The elastic wave device may be the duplexers 201A and 201B and may be the filters 211, 212, 221, and 222. The elastic wave device may be elastic wave resonators of the duplexers 201A and 201B and the filters 211, 212, 221, and 222.

Furthermore, the elastic wave device can be applied to a multiplexer having equal to or more than three filters, such as a triplexer in which antenna terminals of three filters are made common and a hexaplexer in which antenna terminals of six filters are made common.

That is, the above elastic wave device includes the elastic wave resonator, the filter, the duplexer, and the multiplexer including equal to or more than three filters. The multiplexer is not limited to having the configuration including both of a transmission filter and a reception filter and may include only the transmission filter or the reception filter.

The switch 225 connects the antenna element 202 and a signal path corresponding to a predetermined band in accordance with a control signal from a controller (not illustrated) and includes, for example, a SPDT (single pole double throw) type switch. Note that the signal path connected to the antenna element 202 is not limited to one and may be a plurality of signal paths. That is, the high-frequency front end circuit 230 may support carrier aggregation.

The low-noise amplifier circuit 214 is a reception amplifier circuit that amplifies a high-frequency signal (in this example, a high-frequency reception signal) after passing through the antenna element 202, the switch 225, and the duplexer 201A and outputs the amplified high-frequency signal to the RF signal processing circuit 203. The low-noise amplifier circuit 224 is a reception amplifier circuit that amplifies a high-frequency signal (in this example, a high-frequency reception signal) after passing through the antenna element 202, the switch 225, and the duplexer 201B and outputs the amplified high-frequency signal to the RF signal processing circuit 203.

The power amplifier circuits 234a and 234b are transmission amplifier circuits that amplify a high-frequency signal (in this example, a high-frequency transmission signal) output from the RF signal processing circuit 203 and output the amplified high-frequency signal to the antenna element 202 after passing through the duplexer 201A and the switch 225. The power amplifier circuits 244a and 244b are transmission amplifier circuits that amplify a high-frequency signal (in this example, a high-frequency transmission signal) output from the RF signal processing circuit 203 and output the amplified high-frequency signal to the antenna element 202 after passing through the duplexer 201B and the switch 225.

The RF signal processing circuit 203 performs signal processing on the high-frequency reception signal input from the antenna element 202 with a reception signal path interposed therebetween by down-conversion or the like and outputs a reception signal generated by performing the signal processing. The RF signal processing circuit 203 performs signal processing on the input transmission signal by up-conversion or the like and outputs a high-frequency transmission signal generated by the signal processing to the low-noise amplifier circuit 224. The RF signal processing circuit 203 is, for example, an RFIC. The communication apparatus may include a BB (baseband) IC. In this case, the BBIC performs signal processing on the reception signal processed by the RFIC. The BBIC performs signal processing on the transmission signal and outputs the signal to the RFIC. The transmission signal before the signal processing by the BBIC is, for example, an image signal, an audio signal, or the like. Note that the high-frequency front end circuit 230 may include another circuit element between the components described above.

The high-frequency front end circuit 230 may include duplexers according to variations of the duplexers 201A and 201B in place of the duplexers 201A and 201B.

On the other hand, the filters 231 and 232 in the communication apparatus 240 are connected between the RF signal processing circuit 203 and the switch 225 without interposing the low-noise amplifier circuits 214 and 224 and the power amplifier circuits 234a, 234b, 244a and 244b therebetween. The filters 231 and 232 are also connected to the antenna element 202 with the switch 225 interposed therebetween, similarly to the duplexers 201A and 201B.

The high-frequency front end circuit 230 and the communication apparatus 240 configured as described above include the elastic wave resonator, the filter, the duplexer, the multiplexer having equal to or more than three filters, and the like as the elastic wave device of the present invention, thus reducing the loss, improving the frequency temperature characteristics, making the spurious in the higher-order mode be hardly generated, and reducing or preventing the deterioration in the IMD.

Although the elastic wave device, the high-frequency front end circuit, and the communication apparatus according to the preferred embodiments of the present invention have been described with reference to the preferred embodiments and variations thereof, the present invention encompasses other preferred embodiments which are realized by combining desired components in the above-described preferred embodiments and variations, variations which can be obtained by performing, on the above-described preferred embodiments, various modifications that those skilled in the art can conceive without departing from the spirit of the present invention, various apparatuses incorporating the high-frequency front end circuit and the communication apparatus according to preferred embodiments of the present invention.

Preferred embodiments of the present invention are widely applicable to communication equipment such as a cellular phone as an elastic wave resonator, a filter, and a multiplexer applicable to a multiband system, a front end circuit and a communication apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate;
an IDT electrode provided on the piezoelectric substrate; and
a silicon oxide film provided on the piezoelectric substrate so as to cover the IDT electrode; wherein
the IDT electrode includes:
  a first electrode layer; and
  a second electrode layer laminated on the first electrode layer;
the first electrode layer is made of metal or an alloy with a density higher than a density of metal of the second electrode layer and a density of silicon oxide of the silicon oxide film;
the piezoelectric substrate is made of $LiNbO_3$ and θ is in a range of equal to or greater than about 8° and equal to or less than about 32° in Euler Angles (0°±5°, θ, 0°±10°) of the piezoelectric substrate;
the silicon oxide film includes a hydrogen atom, a hydroxyl group, or a silanol group;
the first electrode layer is at least one selected from a group consisting of Pt, W, Mo, Ta, Au, and Cu and alloys containing Pt, W, Mo, Ta, Au, and Cu as main components; and a wavelength determined by an electrode finger pitch of the IDT electrode is λ, and a thickness and a material of the first electrode layer are defined as follows:

| MATERIAL OF FIRST ELECTRODE LAYER | THICKNESS OF FIRST ELECTRODE LAYER |
|---|---|
| Pt OR ALLOY CONTAINING Pt AS MAIN COMPONENT | EQUAL TO OR GREATER THAN 0.047 λ |
| W OR ALLOY CONTAINING W AS MAIN COMPONENT | EQUAL TO OR GREATER THAN 0.062 λ |
| Mo OR ALLOY CONTAINING Mo AS MAIN COMPONENT | EQUAL TO OR GREATER THAN 0.144 λ |
| Ta OR ALLOY CONTAINING Ta AS MAIN COMPONENT | EQUAL TO OR GREATER THAN 0.074 λ |
| Au OR ALLOY CONTAINING Au AS MAIN COMPONENT | EQUAL TO OR GREATER THAN 0.042 λ |
| Cu OR ALLOY CONTAINING Cu AS MAIN COMPONENT | EQUAL TO OR GREATER THAN 0.136 λ. |

2. The elastic wave device according to claim 1, wherein the elastic wave device utilizes a Rayleigh wave; and
a thickness of the first electrode layer is set such that an acoustic velocity of a Shear Horizontal wave is lower than an acoustic velocity of the Rayleigh wave.

3. The elastic wave device according to claim 1, wherein the second electrode layer is made of Al, Cu, or an alloy containing Al or Cu as a main component.

4. The elastic wave device according to claim 3, wherein a thickness of the second electrode layer is equal to or greater than about 0.0175λ.

5. The elastic wave device according to claim 1, wherein a thickness of the silicon oxide film is equal to or less than about 0.40λ.

6. The elastic wave device according to claim 1, wherein a duty ratio of the IDT electrode is equal to or higher than about 0.48.

7. The elastic wave device according to claim 1, wherein a duty ratio of the IDT electrode is equal to or higher than about 0.55.

8. The elastic wave device according to claim 1, wherein θ is in a range of equal to or greater than about 8° and equal to or less than about 30°.

9. The elastic wave device according to claim 1, wherein θ is in a range of equal to or greater than about 8° and equal to or less than about 28°.

10. The elastic wave device according to claim 1, wherein θ is in a range of equal to or greater than about 12° and equal to or less than about 26°.

11. The elastic wave device according to claim 1, further comprising reflectors on both sides of the IDT.

12. The elastic wave device according to claim 1, wherein the elastic wave device is a one port elastic wave resonator.

13. A filter comprising the elastic wave device according to claim 1.

14. The filter according to claim 13, wherein the filter is one of a ladder filter, a longitudinally-coupled resonator filter, and a lattice filter.

15. A high-frequency front end circuit comprising:
the elastic wave device according to claim 1; and
a power amplifier.

16. The high-frequency front end circuit according to claim 15, wherein the elastic wave device defines a duplexer of the high-frequency front end circuit.

17. A communication apparatus comprising:
the high-frequency front end circuit according to claim 15; and
an RF signal processing circuit.

18. The communication apparatus according to claim 17, wherein the elastic wave device defines a duplexer of the high-frequency front end circuit.

* * * * *